(12) United States Patent
Pirovano et al.

(10) Patent No.: US 10,163,506 B2
(45) Date of Patent: Dec. 25, 2018

(54) APPARATUSES INCLUDING MEMORY CELLS AND METHODS OF OPERATION OF SAME

(71) Applicant: Micron Technology, Inc., Boise, ID (US)

(72) Inventors: Agostino Pirovano, Milan (IT); Innocenzo Tortorelli, Cernusco sul Naviglio (IT); Andrea Redaelli, Castatenovo (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/841,118

(22) Filed: Dec. 13, 2017

(65) Prior Publication Data

US 2018/0122472 A1    May 3, 2018

Related U.S. Application Data

(63) Continuation of application No. 15/338,154, filed on Oct. 28, 2016.

(51) Int. Cl.
 *G11C 11/00* (2006.01)
 *G11C 13/00* (2006.01)
(52) U.S. Cl.
 CPC ...... *G11C 13/0069* (2013.01); *G11C 13/0004* (2013.01); *G11C 13/004* (2013.01);
 (Continued)
(58) Field of Classification Search
 CPC . G11C 13/0004; G11C 13/0069; G11C 11/00; G11C 11/16; G11C 11/1675;
 (Continued)

(56) References Cited

U.S. PATENT DOCUMENTS

| 7,106,625 B2 | 9/2006 | Yeh |
| 7,200,045 B2 | 4/2007 | Lue |

(Continued)

FOREIGN PATENT DOCUMENTS

| TW | 201212318 A | 3/2012 |
| TW | 201515197 A | 4/2015 |

(Continued)

OTHER PUBLICATIONS

U.S. Appl. No. 15/231,518, entitled: "Apparatuses Including Multi-Level Memory Cells and Methods of Operation of Same", filed Aug. 8, 2016, pp. all.

(Continued)

*Primary Examiner* — Thong Q Le
(74) *Attorney, Agent, or Firm* — Dorsey & Whitney LLP

(57) ABSTRACT

Disclosed herein is a memory cell including a memory element and a selector device. The memory cell may be programmed with a programming pulse having a first polarity and read with a read pulse having a second polarity. The memory cell may be programmed with a programming pulse having first and second portions. The first and second portions may have different magnitudes and polarities. The memory cell may exhibit reduced voltage drift and/or threshold voltage distribution. Described herein is a memory cell that acts as both a memory element and a selector device. The memory cell may be programmed with a programming pulse having first and second portions. The first and second portions may have different magnitudes and polarities.

18 Claims, 14 Drawing Sheets

(52) U.S. Cl.
CPC ...... *G11C 13/0026* (2013.01); *G11C 13/0028* (2013.01); *G11C 13/0097* (2013.01)

(58) Field of Classification Search
CPC ............ G11C 11/1677; G11C 11/5678; G11C 11/5685; G11C 13/0007; G11C 13/0011; G11C 13/0026
USPC .............................. 365/148, 185.19, 185.22
See application file for complete search history.

(56) References Cited

U.S. PATENT DOCUMENTS

| | | |
|---|---|---|
| 7,289,359 B2 | 10/2007 | Kuo et al. |
| 7,324,377 B2 | 1/2008 | Lee |
| 7,394,680 B2 | 7/2008 | Toda et al. |
| 7,515,461 B2 | 4/2009 | Happ et al. |
| 8,077,505 B2 | 12/2011 | Chen et al. |
| 8,111,541 B2 | 2/2012 | Lai et al. |
| 8,450,713 B2 | 5/2013 | Awaya et al. |
| 8,729,523 B2 | 5/2014 | Pio |
| 8,841,649 B2 | 9/2014 | Pio |
| 9,728,584 B2 | 8/2017 | Ramaswamy et al. |
| 9,799,381 B1 | 10/2017 | Tortorelli et al. |
| 9,805,794 B1 | 10/2017 | Li et al. |
| 2004/0042259 A1 | 3/2004 | Campbell et al. |
| 2004/0062071 A1 | 4/2004 | Rodriguez et al. |
| 2007/0047300 A1 | 3/2007 | Lee et al. |
| 2008/0112211 A1 | 5/2008 | Toda |
| 2008/0205147 A1 | 8/2008 | Santin et al. |
| 2009/0034325 A1 | 2/2009 | Lowrey et al. |
| 2009/0109737 A1 | 4/2009 | Kostylev |
| 2009/0154222 A1 | 6/2009 | Chien et al. |
| 2009/0201740 A1 | 8/2009 | Willer et al. |
| 2009/0279350 A1 | 11/2009 | Chen et al. |
| 2010/0020606 A1 | 1/2010 | Yamada |
| 2010/0067291 A1 | 3/2010 | Fuji |
| 2010/0208508 A1 | 8/2010 | Baek et al. |
| 2010/0226163 A1 | 9/2010 | Savransky |
| 2010/0284211 A1 | 11/2010 | Hennessey |
| 2011/0078776 A1 | 3/2011 | Boyer et al. |
| 2011/0294290 A1 | 12/2011 | Nakanishi et al. |
| 2012/0327708 A1 | 12/2012 | Du et al. |
| 2013/0026438 A1 | 1/2013 | Wang et al. |
| 2013/0044534 A1 | 2/2013 | Kawai et al. |
| 2013/0094275 A1* | 4/2013 | Chen ....................... G11C 11/00 365/148 |
| 2013/0200326 A1 | 8/2013 | Ju et al. |
| 2013/0229846 A1 | 9/2013 | Chien et al. |
| 2013/0322167 A1 | 12/2013 | Krebs |
| 2014/0043911 A1 | 2/2014 | Samachisa et al. |
| 2014/0061574 A1 | 3/2014 | Pio |
| 2014/0063898 A1 | 3/2014 | Fantini et al. |
| 2014/0131653 A1 | 5/2014 | Lee et al. |
| 2014/0192585 A1 | 7/2014 | Hashim et al. |
| 2014/0217349 A1 | 8/2014 | Hopkins |
| 2015/0187416 A1 | 7/2015 | Bedeschi |
| 2015/0243336 A1 | 8/2015 | Karpov et al. |
| 2015/0287460 A1 | 10/2015 | Lee et al. |
| 2015/0311031 A1 | 10/2015 | Platzgummer et al. |
| 2015/0311256 A1 | 10/2015 | Rabkin et al. |
| 2016/0126455 A1 | 5/2016 | Hayashi et al. |
| 2016/0133319 A1 | 5/2016 | Fantini et al. |
| 2016/0225459 A1 | 8/2016 | Boysan et al. |
| 2016/0240249 A1 | 8/2016 | Kellam et al. |
| 2016/0336066 A1 | 11/2016 | Lin et al. |
| 2017/0125097 A1 | 5/2017 | Tortorelli et al. |
| 2017/0125484 A1 | 5/2017 | Pellizzer et al. |
| 2018/0040370 A1 | 2/2018 | Tortorelli et al. |

FOREIGN PATENT DOCUMENTS

| | | |
|---|---|---|
| WO | 2017078932 A1 | 5/2017 |
| WO | 2017078988 A1 | 5/2017 |
| WO | 20180312178 A1 | 2/2018 |

OTHER PUBLICATIONS

U.S. Appl. No. 15/338,154, entitled "Apparatuses Including Memory Cells and Methods of Operation of Same", filed Oct. 28, 2016; pp. all.

Chen et al., "An Access-Transistor-Free (0T/1R) Non-Volatile Resistance Random Access Memory (RRAM) Using a Novel Threshold Switching, Self-Rectifying Chalcogenide Device", Electron Devices Meeting, 2003, IEDM '03 Technical Digest. IEEE International; 4 pages.

First Office Action received for TW Application No. 106128742, dated Jun. 19, 2018.

U.S. Appl. No. 16/105,874 titled "Apparatuses Including Memory Cells and Methods of Operation of Same" filed Aug. 20, 2018.

U.S. Patent Application No. 16/137,950, titled "Apparatuses and Methods Including Memory and Operation of Same", filed on Sep. 21, 2018; pp. all.

* cited by examiner

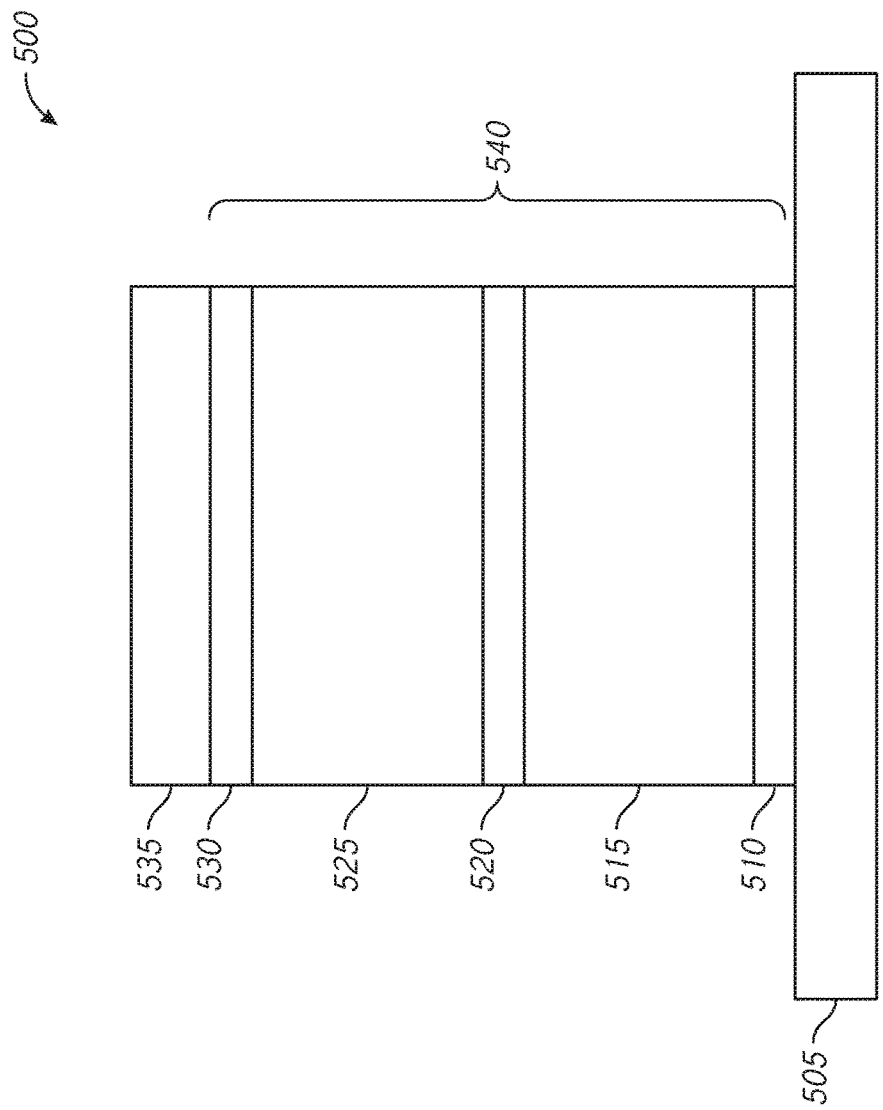

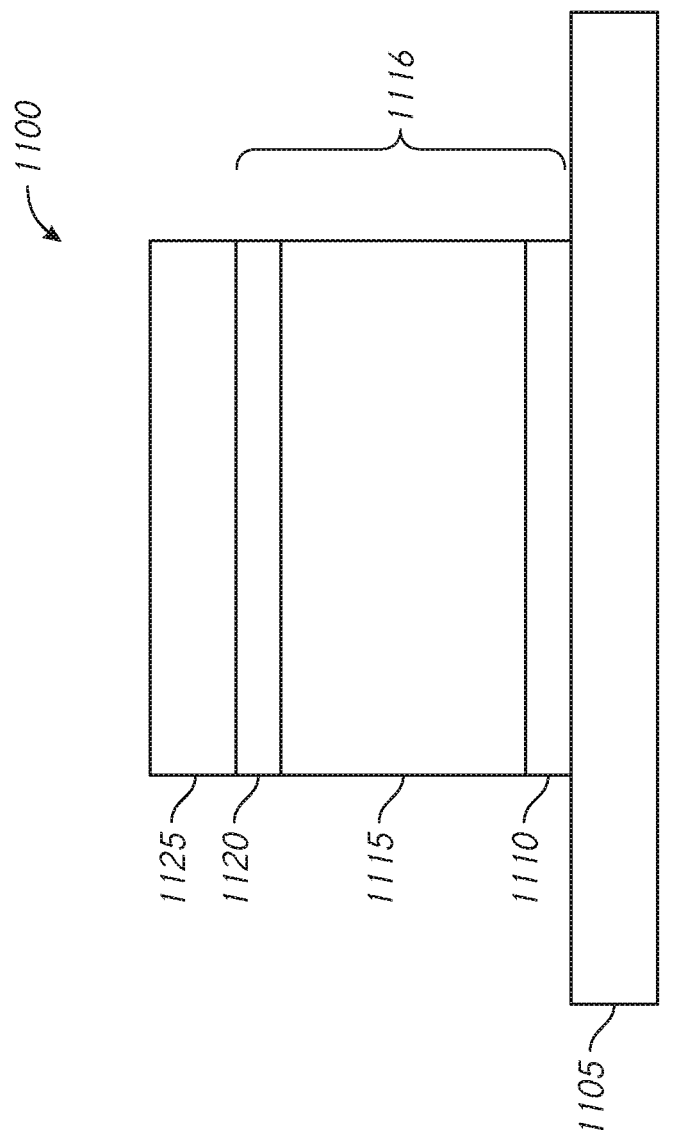

APPARATUSES INCLUDING MEMORY CELLS AND METHODS OF OPERATION OF SAME

CROSS REFERENCE TO RELATED APPLICATIONS

This application is a continuation of pending U.S. patent application Ser. No. 15/338,154 filed Oct. 28, 2016, which application is incorporated herein by reference, in its entirety, for any purpose.

BACKGROUND

Traditional memory cells include a memory element, which is used to store a logic state, and a selector device. The memory element and selector device may be located at a cross-point of a first access line (e.g., word line) and a second access line (e.g., bit line) in a memory array having a cross-point architecture. The selector may be coupled to the word line and the memory element may be coupled to the bit line in some architectures. The memory element may be a phase change material in some architectures. The memory element may be programmed into one of two detectable states (e.g., set and reset) which may correspond to two logic states (e.g. '0' and '1'). In some architectures, the two states may be differentiated by the threshold voltage of the memory cell.

The threshold voltage may be dependent on the state of the memory element and the selector device. The selector device may reduce leakage currents and allow selection of a single memory element for reading data and/or writing data. However, the threshold voltage of the selector device may drift over time. For example, the selector device may have threshold voltage unbiased drift, which may cause the threshold voltage of the selector device to continuously increase over time. The instability of the threshold voltage of the selector device may cause instability in the threshold voltage of the memory cell as a whole. Instability in the threshold voltage of the memory cell may make it more difficult or impossible to determine the state programmed to the memory cell.

BRIEF DESCRIPTION OF THE DRAWINGS

FIG. 5 is a schematic illustration of a portion of a memory array according to an embodiment of the disclosure.

FIG. 11 is a schematic illustration of a portion of a memory array according to an embodiment of the disclosure.

DETAILED DESCRIPTION

Figure 1:
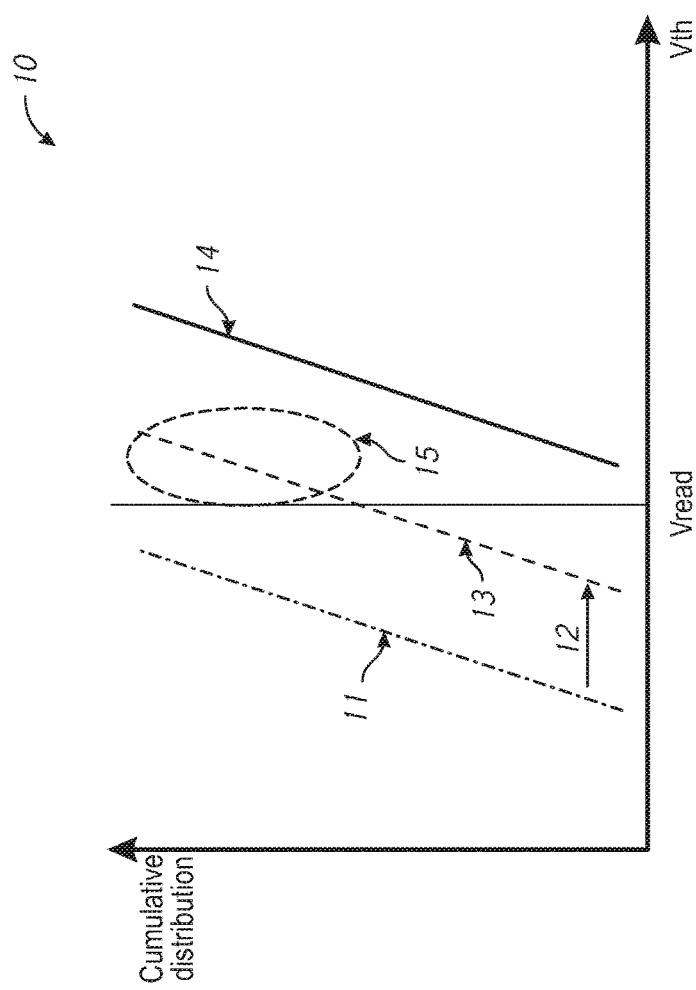
FIG. 1 a voltage plot of threshold voltage distribution and drift in a memory array.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A memory array may include memory cells that each includes a memory element and a selector device. In some embodiments, a memory array may include memory cells in which a single material and/or component acts as a memory element and a selector device (e.g., a self-selecting material with memory properties). A material and/or component that acts as both the memory element and the selector device may be referred to as a storage element. Each memory cell may be programmed to one of a plurality of logic states. The plurality of logic states may be associated with different threshold voltages (e.g., $V_{TH}$) of the memory cell and/or associated with different threshold voltage properties exhibited by the memory cell. A memory cell may exhibit a threshold voltage property, for example, by having or appearing to have a particular threshold voltage. The memory cell may or may not experience a threshold event when exhibiting the threshold voltage properties.

A memory element of a memory cell may include a phase change material (PCM). In some embodiments, the PCM includes a chalcogenide. When the PCM is in an amorphous state, the PCM may have a high resistance. This may be referred to as a reset state. When the PCM is in a crystalline or semi-crystalline state, the PCM may have a lower resistance than when in the amorphous state. This may be referred to as a set state. In some embodiments, the PCM may have multiple crystalline states that may have distinct resistance levels and correspond to different set states. The state of the PCM may depend on a magnitude of a voltage and/or current of a programming pulse applied across the memory cell. As used herein, magnitude may refer to a voltage magnitude or a current magnitude. The programming pulse may heat the memory element to a programming temperature (e.g., 500-700 degrees Celsius). The programming pulse may cause at least a portion of the PCM of the memory element to change phase (e.g., melt), at least temporarily. The change in phase may change the state of the PCM (e.g., set, reset). The change of resistance between the states of the PCM may affect a threshold voltage of the PCM. For example, the memory element may exhibit a different threshold voltage based, at least in part, on the crystalline state of the PCM. The different threshold voltages may correspond to different logic states of the memory cell in some embodiments.

A selector device may be a different material than the memory element in some embodiments. In some embodiments, the selector device may be a different PCM, a chalcogenide material, and/or chalcogenide alloy. However, the chalcogenide material of the selector device may or may not undergo a phase change during reading and/or programming. In some embodiments, the chalcogenide material may not be a phase change material. In some embodiments, threshold voltage properties exhibited by the selector device may depend on the relative voltage polarities of programming and read pulses applied across the memory cell.

FIG. 1 is a plot 10 of threshold voltages of memory cells which may be included in a memory array. The threshold voltages of the memory cells may increase over time in a process referred to as voltage drift. The voltage drift may be unbiased or biased voltage drift, which may be caused at least in part, by instability of selector devices included in the memory cells. Line 11 is a plot of the distribution of threshold voltages of memory cells in an initial set state and line 14 is a plot of the distribution of threshold voltages of memory cells in an initial reset state. In some embodiments, set and reset states may correspond to logic states (e.g., '0' and '1', respectively or '1' and '0', respectively). As shown in plot 10, when a read pulse is applied to a memory cell at voltage Vread, the voltage of the read pulse is above the threshold voltages of memory cells in the set state and below the threshold voltage of the memory cells in the reset state. The state of a given memory cell may be determined based on whether or not it thresholds in response to the read pulse at Vread.

Over time, instability in the selector devices of the memory cells may cause the distribution of set state threshold voltages to increase as shown by arrow 12. The increase in threshold voltages may result in a new threshold voltage distribution of the memory cells, illustrated as line 13. After the distribution has shifted, when a read pulse is applied at voltage Vread, some or all of the memory cells in the set state may have a threshold voltage above the voltage Vread. It may no longer be possible to determine the state of the set memory cells with a threshold voltage above Vread. In FIG. 1, the memory cells in the set state that cannot be differentiated from memory cells in the reset state are indicated by circle 15.

Memory cells are typically programmed and read by applying programming and read pulses with the same polarity. However, as will be described in more detail below, applying programming and/or read pulses with different polarities may improve the stability of the selector devices of the memory cells. This may reduce the extent of the voltage drift of the threshold voltages of the memory cells. Furthermore, applying a programming pulse having a portion with a voltage and/or current that heats the selector device below the melting point of the memory element and/or below the programming temperature of the memory element may reduce the range of the distribution of threshold voltages of the selector devices of the memory cells.

Programming and reading the memory cell in different polarities may not affect the logic state and/or performance of the memory element of the memory cell in some embodiments. The logic state and/or performance of the memory element may be dependent on the voltage, current, and/or time duration of the programming pulse applied across the memory cell. In some embodiments, programming and reading the memory cell in different polarities may affect the performance of the selector device. In some embodiments, the threshold voltage drift and/or distribution of threshold voltages of the selector device may be mitigated, at least in part, by the polarities of the programming and read pulses and/or the relative polarities of the programming and read pulses.

Programming and reading operations may take advantage of different threshold voltage properties of the memory element and selector device that result from the different current and/or voltage magnitudes and/or polarities. Various currents and/or voltages and/or polarities may be applied to the memory cells with various timings, sequences, durations, etc. to affect the programming and reading operations. In some embodiments, the programming pulse and the read pulse may have different polarities to at least partially mitigate the voltage drift of the selector device. In some embodiments, a programming pulse may have a first portion to program a logic state to the memory element and a second portion to at least partially mitigate the voltage drift and/or distribution of the selector device. The first and second portions of the programming pulse may be based, at least in part, on the material properties of the memory element and/or selector device. In some embodiments, the second portion of the programming pulse is a different polarity than the first portion. In some embodiments, the second portion has a lower peak voltage and/or current than the first portion. In some embodiments, a read pulse may have a different polarity than the second portion of the programming pulse.

Figure 2A:
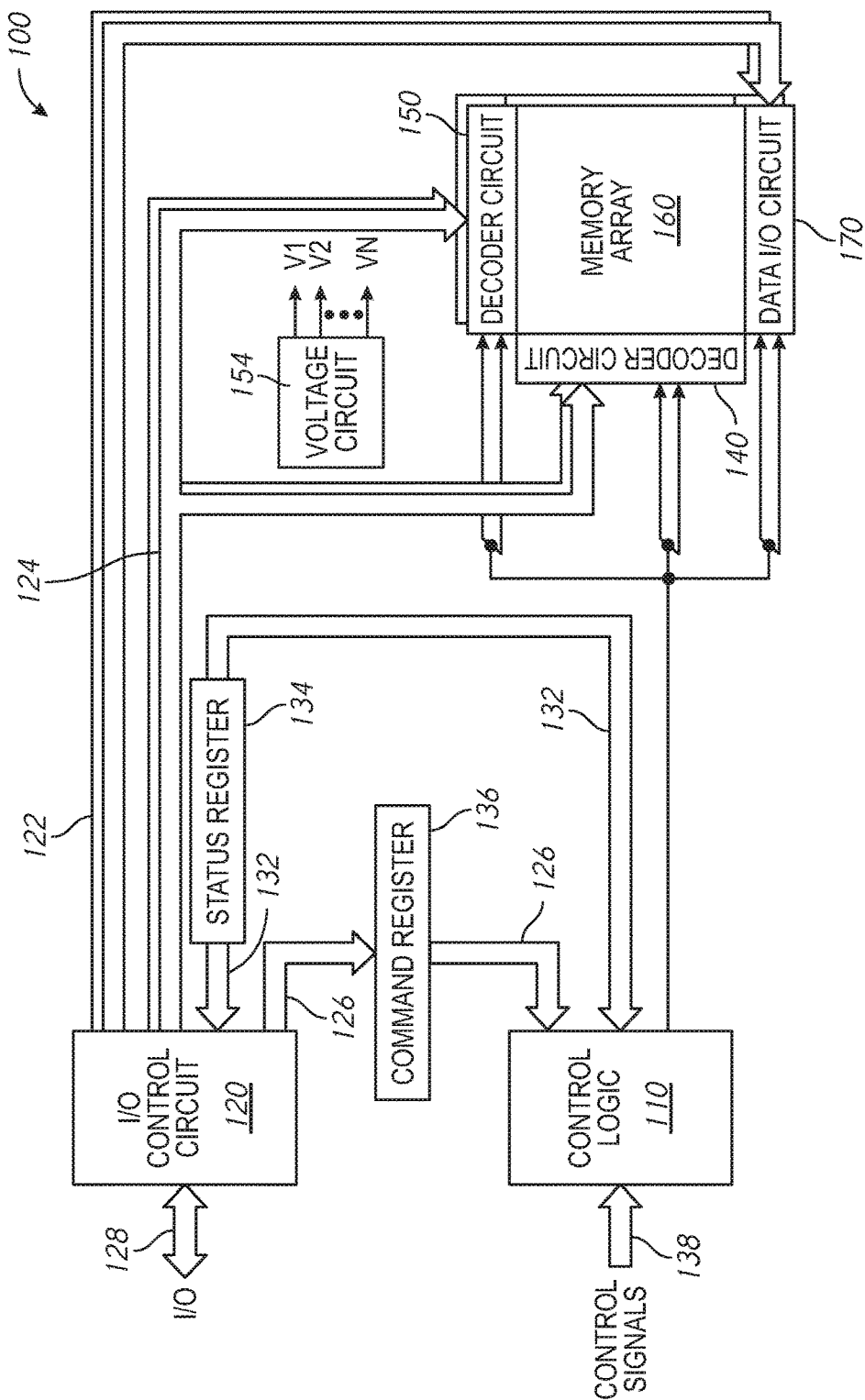
FIG. 2A is a block diagram of a memory according to an embodiment of the disclosure.

FIG. 2A illustrates an apparatus that includes a memory 100 according to an embodiment of the present invention. The memory 100 includes a memory array 160 with a plurality of memory cells that are configured to store data. The memory cells may be accessed in the array through the use of various access lines, word lines (WLs) and/or bit lines (BLs). The memory cells may be non-volatile memory cells, such as NAND or NOR flash cells, phase change memory cells, or may generally be any type of memory cells. The memory cells of the memory array 160 can be arranged in a memory array architecture. For example, in one embodiment, the memory cells are arranged in a three-dimensional (3D) cross-point architecture. In other embodiments, other memory array architectures may be used, for example, a single-deck cross-point architecture, among others. The memory cells may be single level cells configured to store data for one bit of data. The memory cells may also be multi-level cells configured to store data for more than one bit of data (e.g., memory elements of the memory cells may have multiple set states).

An I/O bus 128 is connected to an I/O control circuit 120 that routes data signals, address information signals, and other signals between the I/O bus 128 and an internal data bus 122, an internal address bus 124, and/or an internal command bus 126. An address register (not shown) may be provided address information by the I/O control circuit 120 to be temporarily stored. In some embodiments, the control circuit 120 may include the address register. The I/O control circuit 120 is coupled to a status register 134 through a status register bus 132. Status bits stored by the status register 134 may be provided by the I/O control circuit 120 responsive to a read status command provided to the memory 100. The status bits may have respective values to indicate a status condition of various aspects of the memory and its operation.

The memory 100 also includes a control logic 110 that receives a number of control signals 138 either externally or through the command bus 126 to control the operation of the memory 100. The control signals 138 may be implemented with any appropriate interface protocol. For example, the control signals 138 may be pin based, as is common in dynamic random access memory and flash memory (e.g., NAND flash), or op-code based. Example control signals 138 include clock signals, read/write/program signals, clock enable signals, etc. A command register 136 is coupled to the internal command bus 126 to store information received by the I/O control circuit 120 and provide the information to the control logic 110. The control logic 110 may further access a status register 134 through the status register bus 132, for example, to update the status bits as status conditions change. The control logic 110 may be configured to provide internal control signals to various circuits of the memory 100. For example, responsive to receiving a memory access command (e.g., read, program), the control logic 110 may provide internal control signals to control various memory access circuits to perform a memory access operation. The various memory access circuits are used during the memory access operation, and may generally include circuits such as decoder circuits, charge pump circuits, access line drivers, data and cache registers, I/O circuits, as well as others.

The address register provides block-row address signals to a decoder circuit 140 and column address signals to a decoder circuit 150. The decoder circuit 140 and decoder circuit 150 may be used to select blocks of memory cells for memory operations, for example, read and program operations. The decoder circuit 140 and/or the decoder circuit 150 may include one or more access line drivers configured to provide signals to one or more of the access lines in the memory array 160 to perform memory operations. For example, read pulses and program pulses may be provided to the access lines for read and program operations. The access line drivers may be coupled to access lines of the memory array 160. The access line drivers may drive the access lines with a voltage that is provided by voltage circuit 154. The voltage circuit 154 may provide different voltages V1, V2, . . . , VN with different polarities during operation of the memory 100, for example, during memory access operations. The voltages V1, V2, . . . , VN provided by the voltage circuit 154 may include voltages that are greater than a power supply voltage provided to the memory 100, voltages that are less than a reference voltage (e.g., ground) provided to the memory 100, as well as other voltages.

A data I/O circuit 170 includes one or more circuits configured to facilitate data transfer between the I/O control circuit 120 and the memory array 160 based on signals received from the control logic 110, In various embodiments, the data I/O circuit 170 may include one or more sense amplifiers, registers, buffers, and other circuits for sensing logic states, managing data transfer between the memory array 160 and the I/O control circuit 120. For example, during a write or program operation, the I/O control circuit 120 receives the data to be written through the I/O bus 128 and provides the data to the data I/O circuit 170 via the internal data bus 122. The data I/O circuit 170 writes/programs the data to the memory array 160 based on control signals provided by the control logic 110 at a location specified by the decoder circuit 140 and the decoder circuit 150. During a read operation, the data I/O circuit reads data from the memory array 160 based on control signals provided by the control logic 110 at an address specified by the decoder circuit 140 and the decoder circuit 150. The data I/O circuit provides the read data to the I/O control circuit via the internal data bus 122. The I/O control circuit 120 then provides the read data on the I/O bus 128.

In some embodiments, the control logic 110 controls circuits (e.g., access line drivers) such that during a programming operation on a memory cell of the memory array 160, a first voltage (e.g., 0V) may be provided to a selected word and a second voltage may be provided to a selected bit line. The memory cell may be at the intersection of the selected word line and bit line. The second voltage may be higher or lower than the voltage provided to the word line, based on the logic state to be stored at the address corresponding to the selected word line and hit line. The magnitude of the second voltage may be based on the logic state to be stored at the address corresponding to the selected word line and hit line (e.g., +4V for '0', and +6V for '1'). In some embodiments, during a programming operation, the selected bit line may always be provided a specific voltage, and the word line may be provided a voltage higher or lower than the voltage of the bit line, based on the logic state to be stored at the address. In some embodiments, the word line may be provided with multiple voltage levels during a single programming operation. In some embodiments, the word line may be provided with multiple voltage levels during a single programming operation such that a polarity of the voltage changes during the single programming operation.

In some embodiments, during a read operation on a memory cell, a first voltage (e.g., 0V) may be provided to a selected word line and a second voltage (e.g., −5V, +5V) may be provided to a selected bit line. The memory cell may be at the intersection of the selected word line and bit line. The second voltage may be greater than or less than the first voltage provided to the word line, however, the second voltage may provide the same voltage polarity for every read operation. The logic state of the memory cell may be sensed by a sense amplifier coupled to the selected bit line. The sensed logic state of the memory cell may be provided to the data I/O circuit 170.

Figure 2B:
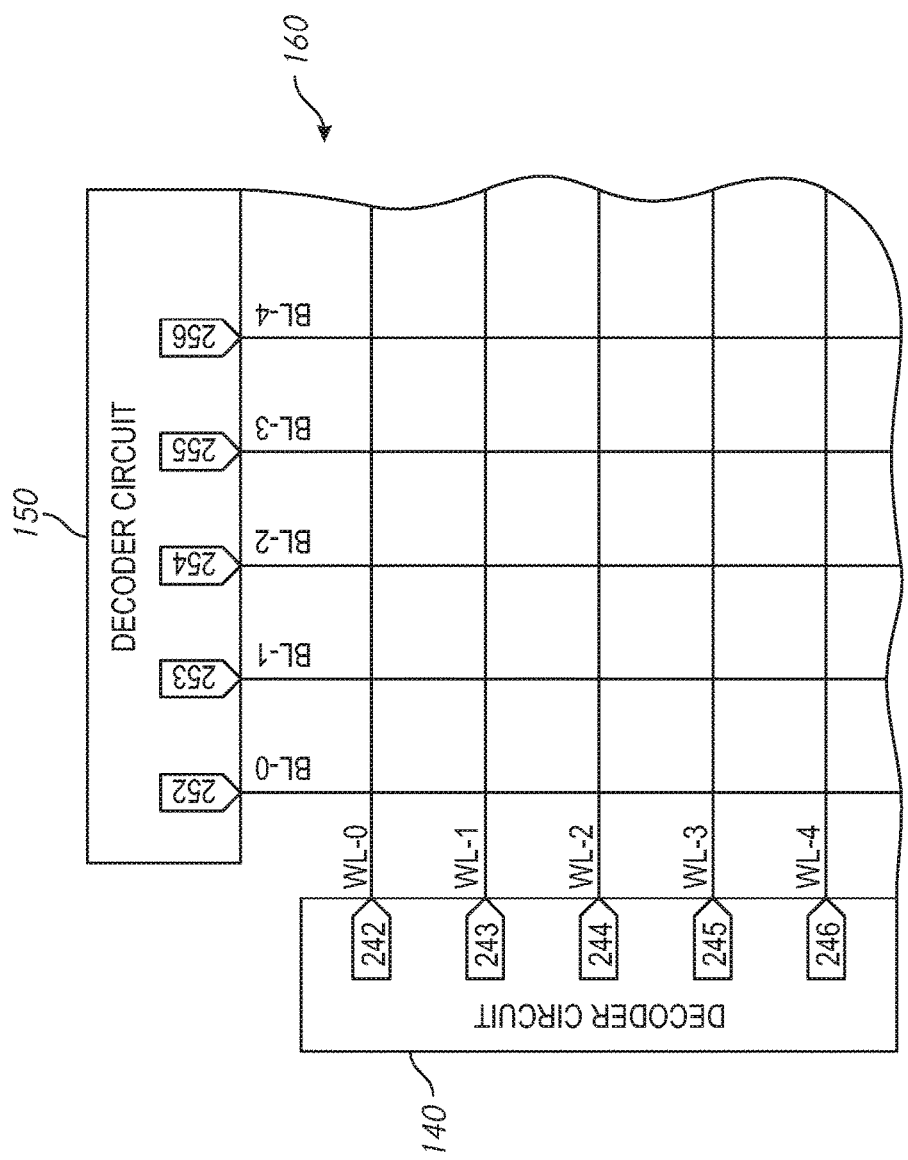
FIG. 2B is a block diagram of a memory array according to an embodiment of the disclosure.

FIG. 2B illustrates a memory array 160 according to an embodiment of the invention. The memory array 160 includes a plurality of access lines, for example, access lines WL-0, WL-1, WL-2, WL-3, WL-4 and access lines BL-0, BL-1, BL-2, BL-3, BL-4. Memory cells (not shown in FIG. 1B) may be at the intersections of the access lines. A plurality of individual or groups of memory cells of the memory array 160 are accessible through the access lines WL-0, WL-1, WL-2, WL-3, WL-4 and access lines BL-0, BL-1, BL-2, BL-3, BL-4. Data may be read from or written to the memory cells. A decoder circuit 140 is coupled to the plurality of access lines WL-0, WL-1, WL-2, WL-3, WL-4, with respective access line drivers 242, 243, 244, 245, 246 biasing each of the respective access lines WL-0, WL-1, WL-2, WL-3, WL-4. A decoder circuit 150 is coupled to the plurality of access lines BL-0, BL-1, BL-2, BL-3, BL-4, with respective access line drivers 252, 253, 254, 255, 256 biasing each of the respective access lines BL-0, BL-1, BL-2, BL-3, BL-4.

Internal control signals are provided, for example, by the control logic 110, to the access line drivers 252, 253, 254, 255, 256 in order to bias the respective access lines BL-0, BL-1, BL-2, BL-3, BL-4, Internal control signals are also provided, for example, also by the control logic 110, to the access line drivers 242, 243, 244, 245, 246 in order to bias the respective word lines WL-0, WL-1, WL-2, WL-3, WL-4. The control logic 110 may be a state machine that, upon receiving commands such as read, write, etc., determines which biasing signals need to be provided to which signal lines at which biasing levels. The biasing signals that need to be provided to the access lines WL-0, WL-1, WL-2, WL-3, WL-4, BL-0, BL-1, BL-2, BL-3, BL-4 may depend on an operation that will be performed responsive to a received command. In some embodiments, decoder circuits 140, 150 may be capable of symmetrical operation in a first polarity and a second polarity. In some embodiments, the decoder circuits 140, 150 may be capable of asymmetrical operation in the first polarity and second polarity. For example, the decoder circuits 140, 150 may provide higher magnitude voltages and/or currents in the first polarity and lower magnitude voltages and/or currents in the second polarity. In some embodiments, asymmetrical decoders may have a smaller layout area.

Figure 3:
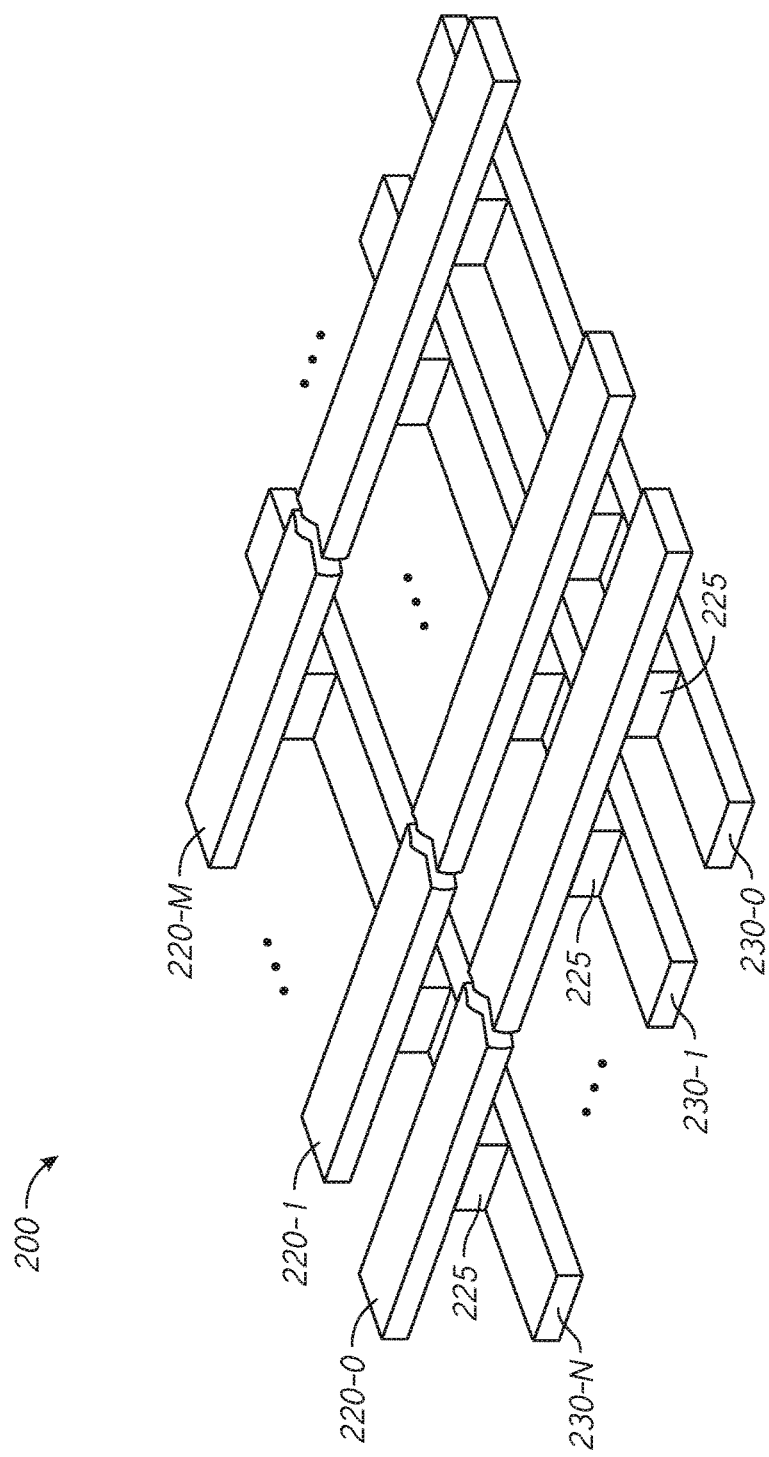
FIG. 3 is a schematic illustration of a portion of a memory array according to an embodiment of the disclosure.

FIG. 3 is a diagram illustrating a portion of an array 200 of memory cells according to an embodiment of the disclosure. The array 200 may be used to implement the memory array 160 of FIG. 1 in some embodiments. In the example illustrated in FIG. 2, the array 200 is a cross-point array including a first number of conductive lines 230-0, 230-1, . . . , 230-N, e.g., access lines, which may be referred to herein as word lines, and a second number of conductive lines 220-0, 220-1, . . . , 220-M, e.g., access lines, which may be referred to herein as bit lines. A memory cell 225 is located at each of the intersections of the word lines 230-0, 230-1, . . . , 230-N and bit lines 220-0, 220-1, . . . , 220-M and the memory cells 225 can function in a two-terminal architecture, e.g., with a particular word line 230-0, 230-1, . . . , 230-N and bit line 220-0, 220-1, . . . , 220-M serving as the electrodes for the memory cells 225.

The memory cells 225 can be resistance variable memory cells, e.g., RRAM cells, CBRAM cells, PCRAM cells, and/or STT-RAM cells, among other types of memory cells. The memory cell 225 can include a material programmable to different logic states e.g., chalcogenide). For example, the memory cell 225 may include a composition that may include selenium (Se), arsenic (As), germanium (Ge), silicon (Si), Tellurium (Te), Antimony (Sb) or combinations thereof. Other materials may also be used. For instance, the memory cell 225 may be programmed to have a particular resistance and/or threshold voltage corresponding to particular logic states responsive to applied programming voltage and/or current pulses, for instance. Embodiments are not limited to a particular material or materials. For instance, the material can be a chalcogenide formed of various doped or undoped materials. Other examples of materials that can be used to form memory elements or selector devices include binary metal oxide materials, colossal magnetoresistive materials, and/or various polymer based resistance variable materials, among others. In some embodiments, memory cells 225 of array 200 may each include a memory element and a selector device. In some embodiments, the memory cells 225 may include a single material and/or component that acts as a memory element and a selector device (e.g., a storage element).

In operation, the memory cells 225 of array 200 can be programmed by applying a voltage, a programming voltage, across the memory cells 225 via selected word lines 230-0, 230-1, . . . , 230-N and bit lines 220-0, 220-1, . . . , 220-M. A sensing, e.g., read, operation can be used to determine the data state of a memory cell 225 by sensing current, for example, on a bit line 220-0, 220-1, . . . , 220-M corresponding to the respective memory cell responsive to a particular voltage applied to the selected word line 230-0, 230-1, . . . , 230-N to which the respective cell is coupled.

Figure 4:
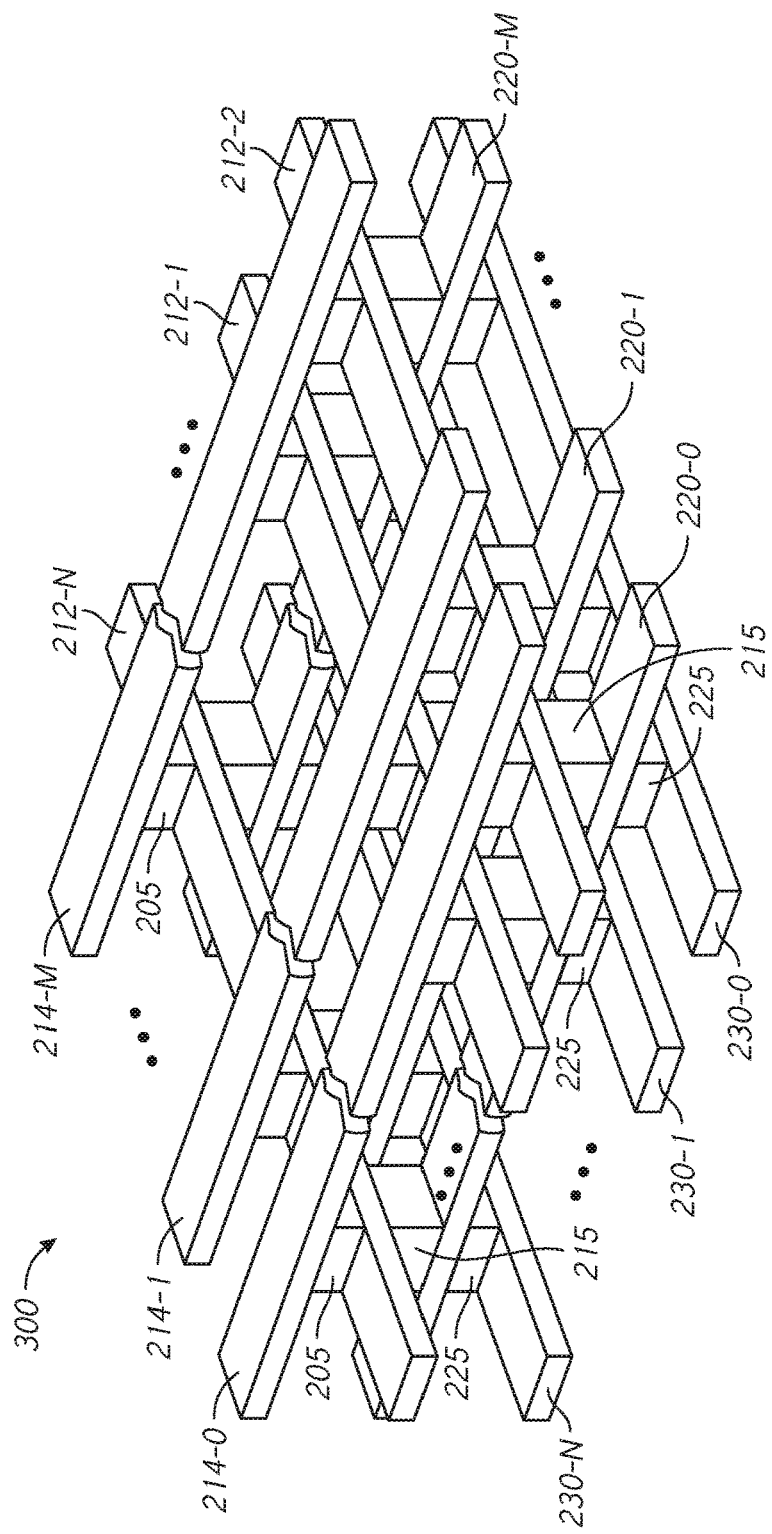
FIG. 4 is a schematic illustration of a portion of a memory array according to an embodiment of the disclosure.

FIG. 4 is a diagram illustrating a portion of an array 300 of memory cells. The array 300 may be used to implement the memory array 160 of FIG. 2.4 in some embodiments. In the example illustrated in FIG. 4, the array 300 is configured in a cross-point memory array architecture, e.g., a three-dimensional (3D) cross-point memory array architecture. The multi-deck cross-point memory array 300 includes a number of successive memory cells, e.g., 205, 215, 225 disposed between alternating, e.g., interleaved, decks of word lines, e.g., 230-0, 230-1, . . . , 230-N and 212-0, 212-1, . . . , 212-N extending in a first direction and bit lines, e.g., 220-0, 220-1, . . . , 220-M and 214-0, 214-1, . . . , 214-M extending in a second direction. The number of decks can be expanded in number or can be reduced in number, for example. Each of the memory cells 205, 225 can be configured between word lines, e.g., 230-0, 230-1, . . . , 230-N and 212-0, 212-1, . . . , 212-N and bit lines, e.g., 220-0, 220-1, . . . , 220-M and 214-0, 214-1, . . . , 214-M, such that a single memory cell 205, 225 is directly electrically coupled with and is electrically in series with its respective bit line and word line. For example, array 300 can include a three-dimensional matrix of individually-addressable, e.g., randomly accessible, memory cells that can be accessed for data operations, e.g., sense and write, at a granularity as small as a single storage element or multiple storage elements. In some embodiments, memory cells 205, 215, 225 of memory array 300 may each include a memory element and a selector device. In some embodiments, the memory cells 205, 215, 225 may include a single material and/or component that acts as a memory element and a selector device (e.g., a storage element). In a number of embodiments, memory array 300 can include more or less decks, bit lines, word lines, and/or memory cells than shown in the examples in FIG. 4.

FIG. 5 is an illustration of a portion of a memory array 500 according to an embodiment of the disclosure. The portion of the memory array 500 may be included in the memory array 160 of FIG. 1. The memory array 500 may include a first access line 505 and a second access line 535. For ease of reference, the first access line may also be referred to as a word line (WL) 505 and the second access line may also be referred to as a bit line (BL) 535. As shown in FIG. 4, the WL 505 extends parallel to the plane of the page, and the BL 535 extends into and out of the plane of the page, perpendicular to the WL 505. A memory cell 540 may be located at the intersection of the WL 505 and BL 535. The memory cell 540 may include a selector device 515. The selector device 515 may be coupled to WL 505 by a first electrode 510 and coupled to a second electrode 520. The electrode 520 may couple the selector device 515 to a memory element 525 included in the memory cell 540. The memory element 525 may be coupled to BL 535 by a third electrode 530. The memory element 525 may include a chalcogenide material. In some embodiments, the chalcogenide material may be a phase change material, but other materials may be used. In some embodiments, the selector device 515 may also include a chalcogenide material. In some embodiments, the selector device 515 may include a material that does not undergo a phase change during operation. In some embodiments, the memory element 525 and/or selector device 515 may include a ternary composition that may include selenium (Se), arsenic (As), germanium (Ge), Tellurium (Te), Antimony (Sb), and combinations thereof. In some embodiments, the memory element 525 and/or selector device 515 may include a quaternary composition that may include silicon (Si), Se, As, Tellurium (Te), Antimony (Sb), and combinations thereof. Other materials may also be used.

As will be described in more detail below, voltages and/or currents may be provided to the memory cell 540 using the first and second access lines WL 505 and BL 535. The first and second access lines WL 505 and BL 535 may also be used to sense a voltage and/or current of the memory cell 540, as well. Voltages and/or currents may be provided to the memory cell 540 to program a logic state to the memory cell, and voltages and/or currents may be sensed to read data from the memory cell 540. Circuits, such as access line drivers may be coupled to the access lines WL 505 and BL 535 to provide the voltages to the memory cell 540, and a sense amplifier may be coupled to the access lines WL 505 and/or BL 535 to sense a voltage and/or current of the memory cell 540. Based on the voltage and/or current that is sensed, a logic state or logic states stored by the memory cell 540 may be determined.

The memory element 525 may be written to store one of at least two different logic states (e.g., '1,' '0') by a programming operation. In some embodiments, the different logic states may be represented by different threshold voltages ($V_{TH}$) of the memory element 525. For example, a '1' logic state may be represented by a first $V_{TH}$ and a '0' logic state may be represented by a second $V_{TH}$. The threshold voltage the memory element 525 exhibits may be based on a state of a phase change material (PCM) included in the memory element 525 (e.g., amorphous/reset or crystalline/set). The state of the PCM may be based, at least in part, on the magnitude of a current and/or voltage of a programming pulse applied to the memory cell 540 during a programming operation. In some embodiments, the state of the PCM may be independent of a polarity of the current and/or voltage of the programming pulse. The state of the memory element 525 may be determined by applying a read pulse during a read operation. The programming pulse and read pulse may be applied to the memory cell 540 using the first and second access lines 505 and 535.

The selector device 515 may exhibit different threshold voltages ($V_{TH}$). The selector device 515 may exhibit different properties (e.g., voltage drift, distribution of threshold voltages). The threshold voltage the selector device 515 exhibits may be based on a polarity of a programming pulse applied to the memory cell 540 during a program operation and a polarity of a read pulse applied to the memory cell 540 during a read operation. The programming pulse and read pulse may be applied to the memory cell 540 using the first and second access lines 505 and 535.

The memory cell 540 may be configured as a two-terminal device between the BL 535 and WL 505 in some embodiments. A first logic state may be written to the memory cell 540 by applying a voltage (e.g., a programming pulse) across the memory cell 540 in a first polarity at a first voltage or current. A second logic state may be written to the memory cell 540 by applying a voltage (e.g., a programming pulse) across the memory cell 540 in the first polarity at a second voltage or current.

The memory cell 540 may be read by applying a voltage (e.g., a read pulse) across the memory cell 540 (e.g., using BL 535 and WL 505). In some embodiments, the memory cell 540 is read by applying a voltage across the memory cell 540 in the first polarity. In other embodiments, the memory cell 540 is read by applying a voltage across the memory cell 540 in a second polarity. The memory cell 540 may always be read with the same polarity. In some embodiments, the memory element 525 may exhibit the same threshold voltage regardless of the polarity of the programming and read pulses. In some embodiments, the threshold voltage of the memory element 525 may be based on the magnitude and/or duration of the programming pulse applied across the memory cell 540. The different threshold voltages of the memory cell 540, based on the threshold voltages of the memory element 525 and selector device 515, may be used to represent different logic states.

When the memory cell 540 is a two-terminal device, the relative values of the voltages between the terminals determines the magnitude and the polarity of the voltage or current applied across the memory cell 540. For example, providing a voltage of 3V to the BL 535 and 0V to WL 505 results in the same magnitude and polarity of voltage as providing a voltage of 6V at BL 535 and 3V at WL 505. Other non-negative (e.g., 0V or greater), negative, and/or positive voltages may be provided to the memory access lines in some embodiments. As used herein, forward polarity indicates that the BL 535 is set at a higher voltage than the WL 505 and reverse polarity indicates that the BL 535 is set at a lower voltage than the WL 505. However, the use of "forward" and "reverse" polarities is by way of example, and the embodiments of the invention are not limited to those of the particular polarity directions described herein.

Figure 6B:
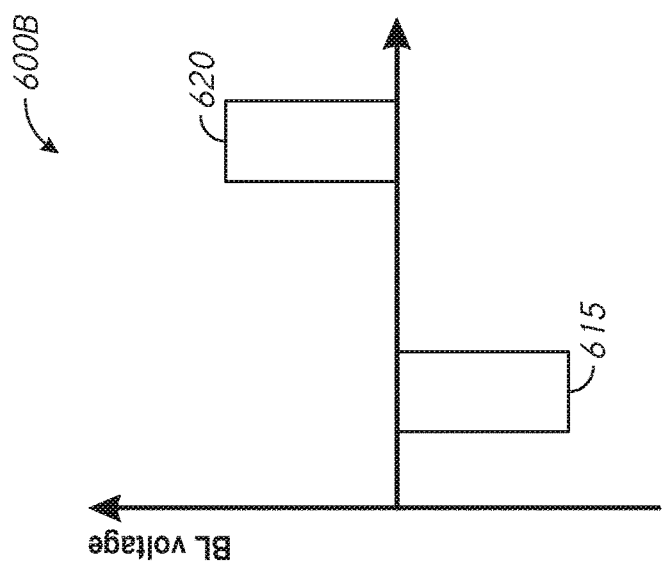
FIG. 6B is a voltage plot of a programming pulse and a read pulse according to an embodiment of the disclosure.
Figure 6A:
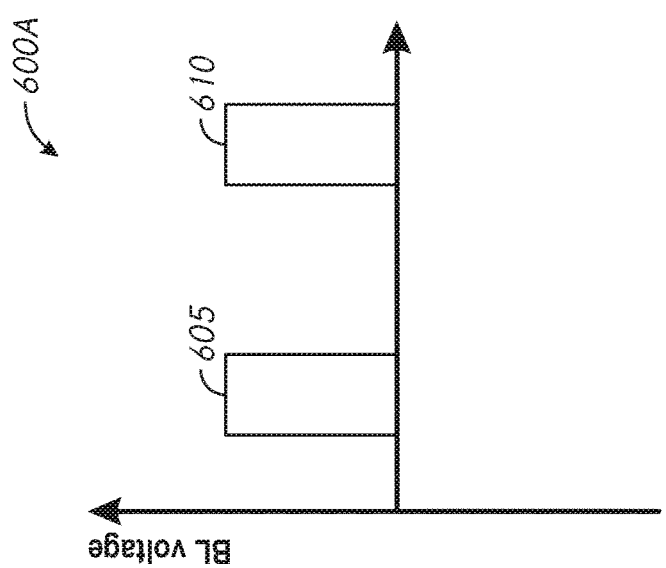
FIG. 6A is a voltage plot of an example programming pulse and an example read pulse for a memory.

FIG. 6A is a voltage plot of an example of a programming pulse 605 and a read pulse 610 in conventional memory. A memory cell may be programmed by a programming pulse 605. The memory cell programmed by programming pulse 605 may be read by read pulse 610. As shown in FIG. 6A, both the programming pulse 605 and read pulse 610 are in forward polarity. However, the programming pulse 605 and read pulse 610 may both have reverse polarity. As mentioned previously, the memory cell may suffer from voltage drift when the programming pulses and read pulses are the same polarity.

FIG. 6B is a voltage plot of a programming pulse 615 and a read pulse 620 according to an embodiment of the disclosure. In the example shown in FIG. 6B, both the programming pulse 615 and read pulse 620 are shown as square pulses. However, the pulses may be other shapes (e.g., ramp, staircase, sinusoidal). In some embodiments, square programming pulses may have sloped sides and/or rounded corners. A memory cell may be programmed by a programming pulse 615. The programming pulse 615 may have a voltage and/or current that may melt a PCM included in a memory element of the memory cell. The programming pulse 615 may be of a magnitude and/or duration to cause the PCM to achieve a degree of crystallinity for a logic state. In some embodiments, the programming pulse 615 may cause a phase change (e.g., melt, solid state re-crystallization) in at least a portion of the PCM of the memory element. The memory cell programmed by programming pulse 615 may be read by read pulse 620. Although the magnitude and duration of read pulse 620 are shown to be equal to the magnitude and duration of programming pulse 615, in some embodiments, the read pulse 620 may have a lower or higher magnitude and shorter or longer duration than the programming pulse 615. As discussed in reference to FIG. 1, the magnitude of the read pulse 620 may be selected to fall between the threshold voltage of memory cells in the set state and memory cells in the reset state in some embodiments. As shown for the embodiment of FIG. 6B, the programming pulse 615 is in reverse polarity and the read pulse 620 is in forward polarity. However, the programming pulse 615 may have forward polarity and the read pulse 620 may have reverse polarity. Applying programming and read pulses in opposite polarities as shown in FIG. 6B may mitigate voltage drift.

In some embodiments, a programming pulse in a polarity opposite that of a read pulse may be applied only when a set state is programmed to a memory cell. In some embodiments, a programming pulse in a polarity opposite that of a read pulse may be applied only when a reset state is programmed to a memory cell. In some embodiments, a programming pulse in a polarity opposite that of a read pulse may be applied regardless of the state programmed to the memory cell.

In some embodiments, the selector device may be sensitive to the polarity of the final portion of the programming pulse. Accordingly, a programming pulse may include voltages and/or currents in multiple polarities. For example, a programming pulse may have a first portion in a first polarity and a second portion in a second polarity, and the selector device's performance may be based on the second polarity. A programming pulse with multiple polarities may be advantageous when the voltage and/or current required to mitigate instability in the selector device is different than the voltage and/or current required to program the memory element. Decoders included in a memory with the memory cells need not be fully symmetrical if higher voltage and/or currents are applied only in one polarity while lower voltage and/or currents are applied in another polarity. Asymmetrical decoders may have a smaller layout than fully symmetrical decoders. Furthermore, a memory having a programming pulse with multiple polarities may not require changing polarities of a read pulse.

Figure 7:
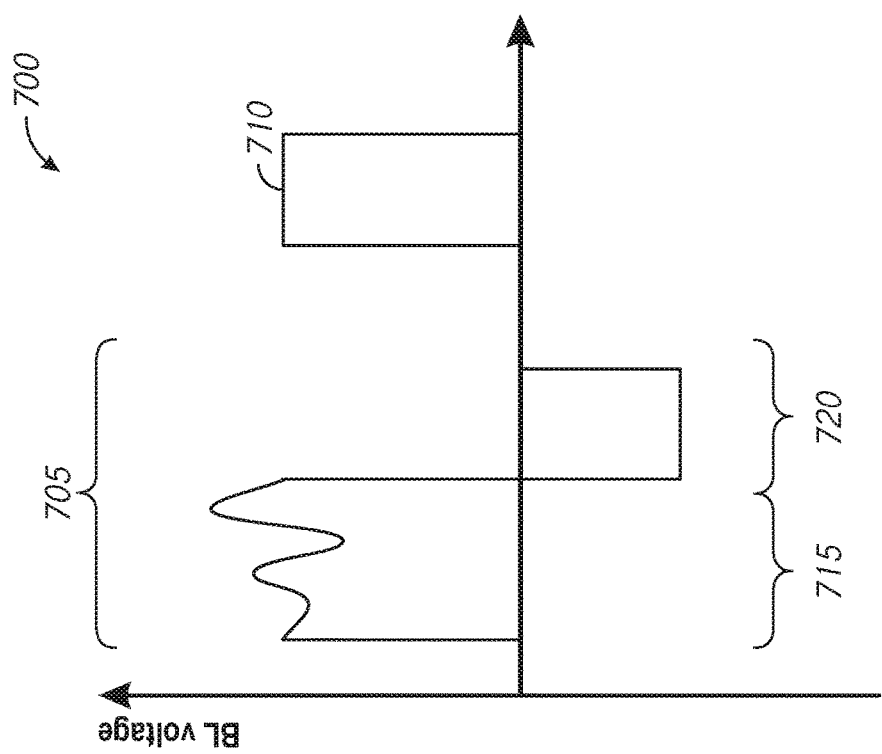
FIG. 7 is a voltage plot of a programming pulse having first and second portions according to an embodiment of the disclosure.

FIG. 7 is a voltage plot of a programming pulse 705 having a first portion 715 and a second portion 720 according to an embodiment of the disclosure. A read pulse 710 is also illustrated. In the embodiment of FIG. 7, the read pulse 710 has a polarity as that is the same as the first portion 715 of the programming pulse 705. Programming pulse 705 may be configured to program a logic state in a memory element of a memory cell and to mitigate instability in a selector device of the memory cell. The first portion 715 and second portion 720 may have different polarities.

In some embodiments, the first portion 715 may program a logic state to the memory element and the second portion 720 may mitigate instability in the selector device. The first portion 715 may include one or more voltages and/or currents each lasting a particular period of time. The shape of the first portion 715 may be based, at least in part, on the characteristics of a PCM included in the memory element and/or other materials included in the memory cell. In other words, the first portion 715 may program the memory element of the memory cell. The magnitude and/or duration of the first portion 715 may at least temporarily change a phase of at least a portion of a PCM of the memory element. For example, the first portion 715 may melt at least a portion of the PCM. Changing the phase of at least a portion of the PCM may program the logic state to the memory element.

The second portion 720 is shown as a square pulse in FIG. 7, but the second portion may be other shapes (e.g., ramp, staircase, sinusoidal). The shape of the second portion 720 may be based, at least in part, on the characteristics of the memory element and/or the selector device. The magnitude of the second portion 720 may be greater than a threshold voltage of the selector device. In some embodiments, the magnitude of the second portion 720 may be less than a magnitude required to change a phase of a PCM of the memory element but equal or greater than a magnitude required to achieve a temperature effect in the selector device. The temperature effect in the selector device may reduce the distribution of threshold voltages in the memory cells in some embodiments. The temperature required to achieve a temperature effect in the selector device may be referred to as an activation temperature of the selector device. The activation temperature of the selector device may be based, at least in part, on material characteristics of the selector device. Without being bound to a particular theory, the activation temperature achieved by the second portion 720 of the programming pulse 705 may allow atom redistribution that improves the distribution of atoms in the selector device. Without being bound to a particular theory, the activation temperature may allow electron redistribution that improves the distribution of electrons in the selector device in addition to or instead of entire atoms. In some embodiments, the duration of the second portion 720 may provide adequate time for atom redistribution (e.g., 20-50 ns).

In some embodiments, the magnitude of the second portion 720 of the programming pulse 705 may be a magnitude to reduce elemental segregation in the selector device. The second portion 720 may reduce elemental segregation within an alloy of the selector device. In some embodiments, the compositional gradient of the selector device may be reduced by the second portion 720. That is, the material composition of the selector device may be uniform or more uniform along one or more physical dimensions (e.g., top-to-bottom, side-to-side, proximate to word line-to-proximate to bit line) of the selector device. Without being bound to a particular theory, the voltage and/or current magnitude of the second portion 720 may mitigate an electric-field driven elemental segregation effect in the selector device. For example, in a typical selector device including an As—Se alloy, may initially have a substantially uniform concentration of As (e.g., between 25-30%) and Se (e.g., between 40-45%) over the entire volume of the selector device. After the memory cell is programmed to a set state, the selector device may have a higher concentration of As at the bottom of the selector device compared to the top of the selector device (e.g., 35-40% at the bottom and 15-20% at the top). Similarly, the selector device may have a higher concentration of Se at the top of the selector device compared to the bottom of the selector device after the memory cell is programmed to a set state (e.g., 50-55% at the top and 30-35% at the bottom). These differences in concentrations of As and Se at the top and bottom of the selector device create a compositional gradient from top to bottom in the selector device. The compositional gradient may degrade the performance of the selector device in some applications. According to principles of the disclosure, applying the second portion 720 of the programming pulse 705 may reduce or eliminate the compositional gradient when the memory cell is programmed to a set or reset state. Continuing the example above, the concentration of As and/or Se in the selector device may remain substantially uniform (e.g., within 5% or within 10%) from top to bottom when the second portion 720 is applied to the memory cell.

In some embodiments, the different polarity of the second portion 720, compared to the first portion 715 and a read pulse 710, may contribute to the reduced threshold voltage distribution. Although not shown in FIG. 7, in some embodiments, the second portion 720 may have the same polarity as the read pulse 710. However, in these embodiments, while reduced threshold voltage distribution may be achieved, voltage drift mitigation may be compromised.

The programming pulses 615 and 705 shown in FIGS. 6B and 7 may be used to program a logic state to a memory cell, such as memory cell 540 shown in FIG. 5, during a programming operation. The programming pulses may be applied by providing a first voltage to the BL and providing a second voltage to the WL. Circuits coupled to access lines to which memory cells may be coupled may be used to provide the first voltage, for example, access line drivers included in the decoder circuits 140 and 150 of FIG. 2. The circuits may be controlled by the internal control signals provided by a control logic, for example, control logic 110 of FIG. 2. In some embodiments, the programming pulses may be configured by signals provided by the control logic 110. The resulting voltage applied to the memory cell is the difference between the first and second voltages. The programming pulses may be the same duration as read pulses in some embodiments. In some embodiments the duration is 10 ns-50 ns. In some embodiments, the duration may be 1-100 ns. In some embodiments, the duration may be 1 ns-1 µs. In some embodiments, for programming pulses having first and second portions, the first portion of the programming pulse may be longer than the second portion of the programming pulse (e.g., 60-100 ns and 20 ns-50 ns). In some embodiments, the first and second portions may have equal durations (e.g., 50 ns and 50 ns). In some embodiments, the first portion may be shorter than the second portion. Programming the memory cell may take more or less time as reading the memory cell in some embodiments.

Circuits coupled to access lines to which memory cells may be coupled may be used to provide the read pulses, for example, access line drivers included in the decoder circuits 140 and 150 of FIG. 2. The circuits may be controlled by the internal control signals provided by a control logic, for example, control logic 110 of FIG. 2. A read pulse may be a voltage $V_R$ applied to the memory cell for a period of time (e.g., 10 ns-50 ns, 1 ns-10 ns, 1 ns-1 µs). Although shown as square pulses in FIGS. 6B and 7, read pulses of other shapes may be implemented. Other suitable read pulse shapes include, but are not limited to, triangular, trapezoidal, staircase, and/or sinusoidal. In some embodiments, read pulses may include leading and/or trailing edges. Although read pulses 620 and 710 are shown as having forward polarity, the read pulses 620 and 710 may be implemented in reverse polarity when the programming pulse and/or final portion of the programming pulse is implemented in forward polarity. In some embodiments, the read pulses may always be applied with the same polarity (e.g., all read pulses exhibit forward polarity, all read pulses exhibit reverse polarity).

Although the programming and read pulses shown in FIGS. 6B and 7 are plotted and described with respect to voltage, the pulses could be plotted and described with respect to current and be within the scope of the present disclosure. Voltage and current are proportionally related, and absent other factors, increasing or decreasing the current of a programming and/or read pulse may have a similar effect on the operation of a memory device as increasing or decreasing the voltage of a programming or read pulse in some embodiments. For example, programming pulses 615 may have current magnitudes from 60-130 µA and time durations from 10 ns-1 µs in some embodiments. In another example, programming pulse 705 may have a first portion 715 may have current magnitudes from 60-130 µA and time durations from 10 ns-1 µs in some embodiments. Continuing this example, the second portion 720 may have current magnitudes from 20-130 µA and time durations from 10-50 ns. The magnitudes and time durations of programming pulses 615 and 705 may be based, at least in part, on a state to be programmed to the memory element.

Figures 8A, 8B:
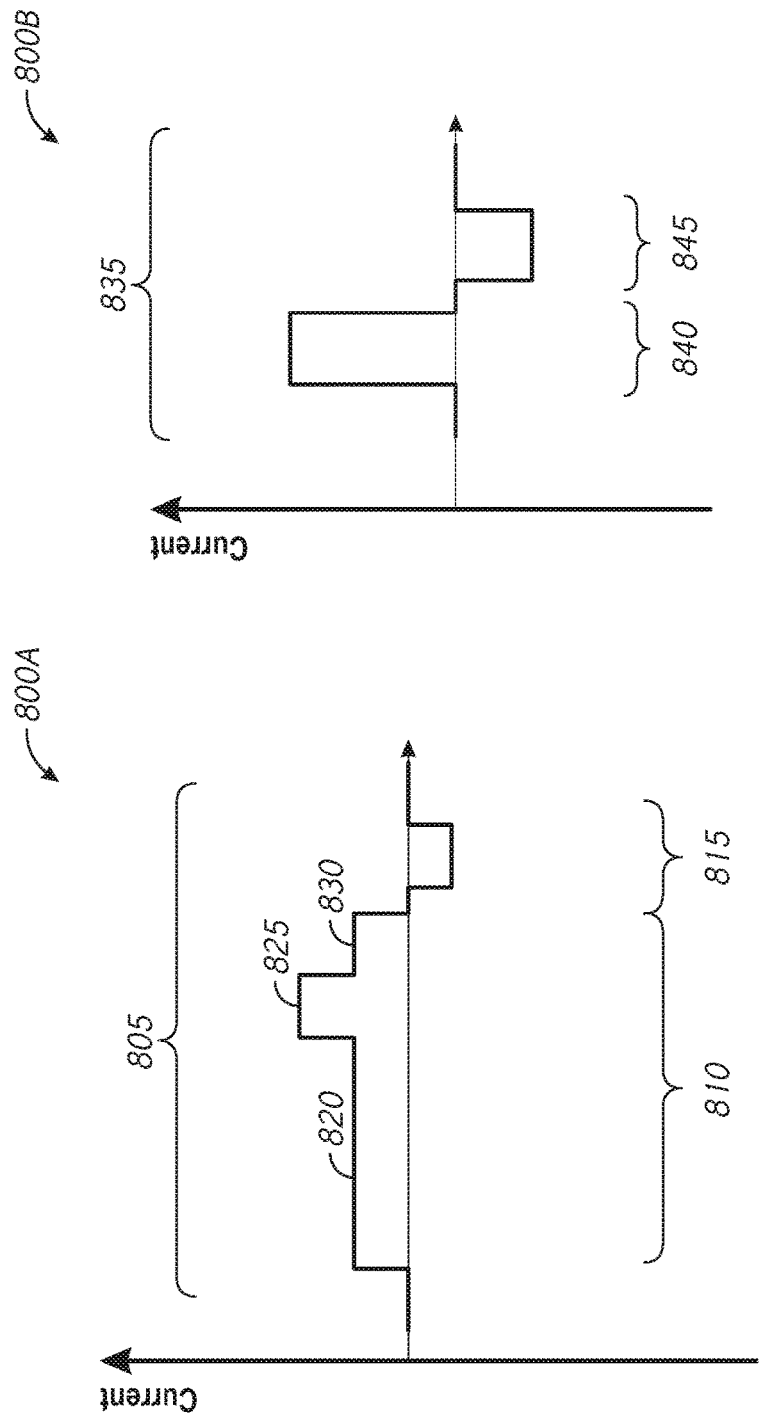
FIG. 8A is a current plot of a programming pulse according to an embodiment of the disclosure.
FIG. 8B is a current plot of a programming pulse according to an embodiment of the disclosure.

Example programming pulses plotted with respect to current are shown in plots 800A and 800B of FIGS. 8A and 8B. The programming pulses in FIGS. 8A and 8B are exemplary and the disclosure is not limited to the particular programming pulses 805 and 835. In some embodiments, the programming pulses 805 and 835 may be used to implement programming pulse 705 shown in FIG. 7. In some embodiments, programming pulse 805 may program a set state to the memory element and programming pulse 835 may program a reset state to the memory element. In the example shown in FIG. 8, the first portion 810 of programming pulse 805 has three current magnitudes. The first magnitude 820 may be 30 µA and may have a time duration of 600 ns. The second magnitude 825 may be 60 µA and may have a time duration of 50 ns. The third magnitude 830 may be 30 µA and may have a time duration of 50 ns. The second portion 815 of programming pulse 805 may have a current magnitude of 20 µA and may have a time duration of 20 ns. As illustrated in FIG. 8A, the current magnitudes 820, 825, and 830 of the first portion 810 have a first polarity (e.g., forward polarity) and the second portion 815 has a second polarity (e.g., reverse polarity) opposite the first polarity.

Programming pulse 805 is provided as an example, and other programming pulses may be used. For example, another magnitude may be implemented between magnitudes 820 and 825. This additional magnitude may be 35 µA and have a time duration of 50 ns. In another example, the second portion 815 may have a magnitude of 50 µA and may have a duration between 10 ns. Programming pulse 805 may have current and/or voltage magnitudes and time durations based, at least in part, on the material properties of the memory element and/or selector device of the memory cell. The first portion 810 of programming pulse 805 may be configured to program a set state to the memory element in some embodiments.

Example programming pulse 835 of FIG. 8B may have a first portion 840 with a magnitude of 130 µA and may have a time duration of 20 ns. The second portion 845 of programming pulse 835 may be 20 µA and have a time duration of 20 ns. Programming pulse 835 is provided as an example, and other programming pulses may be used. For example, the first portion 840 may be 130 µA and have a time duration of 12 ns. The second portion 845 may be 50 µA and have a time duration of 10 ns. Programming pulse 835 may have current and/or voltage magnitudes and time durations based, at least in part, on the material properties of the memory element and/or selector device of the memory cell. The first portion 840 of programming pulse 835 may be configured to program a reset state to the memory element in some embodiments. As illustrated in FIG. 8B, the current magnitude of the first portion 840 has a first polarity (e.g., forward polarity) and the second portion 845 has a second polarity (e.g., reverse polarity) opposite the first polarity.

In some embodiments, the memory cell may be implemented using the memory cell 540 illustrated in FIG. 5. A read pulse may be applied by providing a first voltage to a bit line (e.g., BL 535) and providing a second voltage to a corresponding word line (e.g., WL 505). A sense amplifier (not shown) coupled to a bit line associated with the memory cell to be read may be used to detect a current through the memory cell. The sense amplifier may be configured to sense the current through the memory cell responsive to the read operation and provide an output signal indicative of the logic state stored by the memory cell. The sense amplifier may be included in a memory that includes the memory cell. For example, the sense amplifier may be included with other read and programming circuits, decoding circuits, register circuits, etc. of the memory that may be coupled to a memory array. When a read pulse is applied to a memory cell, the memory cell conducts current when the read pulse exceeds the threshold voltage of the memory cell. The sense amplifier may detect a current $I_S$ through the memory cell. When a read pulse below the threshold voltage is applied to a memory cell, the memory cell does not conduct current. The sense amplifier may detect little or no current through the memory cell. In some embodiments, a threshold current $I_{TH}$ may be defined for sensing the logic state stored by the memory cell. The threshold current $I_{TH}$ may be set above a current that may pass through the memory cell when the memory cell does not threshold in response to the read pulse, but equal to or below an expected current through the memory cell when the memory cell does threshold in response to the read pulse. That is, the threshold current $I_{TH}$ should be higher than a leakage current of the bit line and/or word line. When sense amplifier detects $I_S \geq I_{TH}$, a logic state may be read from the memory cell. Other methods of detecting a current and/or a voltage across the memory cell may be used.

The threshold event may be used to determine the logic state of the memory cell in some embodiments. For example, using the ramp read pulse 710 shown in FIG. 7, a threshold event (e.g., $I_S \geq I_{TH}$), may be detected when the read pulse 710 is at a voltage ($V_R$). Based, at least in part, on whether a threshold event is detected, the logic state of the memory cell may be determined. Continuing this example, a read pulse may have a voltage $V_R=5V$, a memory cell in a set state may have a threshold voltage $V_{SET}=4V$, and a memory cell in a reset state may have a threshold voltage $V_{RESET}=6V$. If a threshold event is detected in response to a read pulse, the memory cell may be determined to be in a set state. If a threshold event is not detected in response to a read pulse, the memory cell may be determined to be in a reset state.

Figure 9:
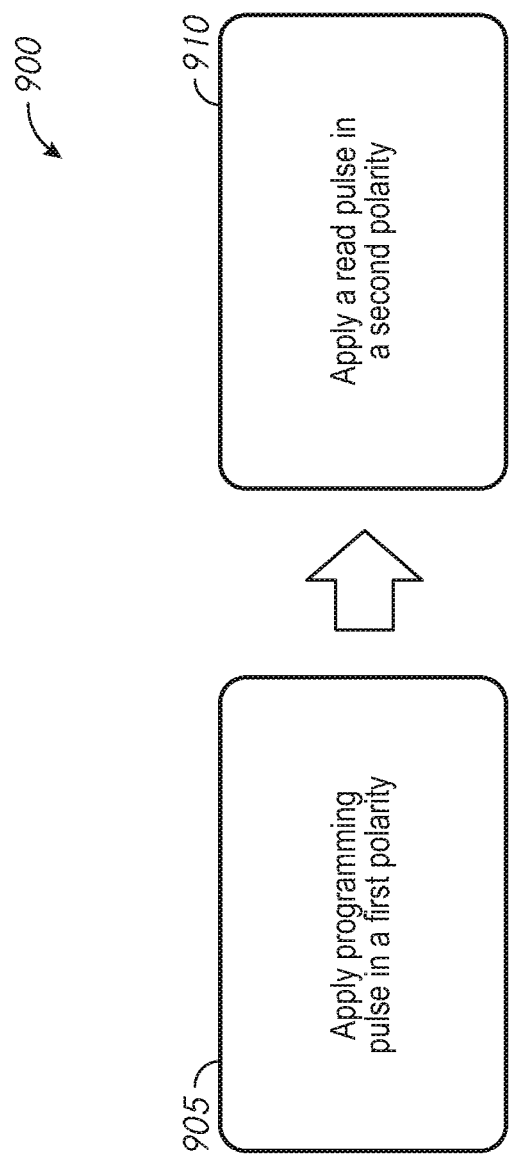
FIG. 9 is a flow chart of a method according to an embodiment of the disclosure.

FIG. 9 is a flow chart of a method 900 for programming a memory cell according to an embodiment of the disclosure. For example, the method 900 may be used with programming and read pulses shown in FIG. 6B. In some embodiments, the method 900 may be used by the memory 100 of FIG. 2 for programming logic states, and the memory cell may be implemented by memory cell 540 shown in FIG. 5. For example, the control logic 110 may provide internal control signals to various circuits in the memory 100 to perform the method 900. At Step 905, a programming pulse is applied in a first polarity. The programming pulse may be applied across the memory cell 540 to program a state of the memory cell 540. The programming pulse may cause at least a temporary phase change to a portion of the memory element 525. A magnitude and/or duration of the programming pulse may be based on a logic state to be programmed to the memory element 525. For example, a high magnitude may be selected to program '0' and a low magnitude may be selected to program '1' to the memory element 525. A polarity of the programming pulse may be selected based on a polarity of a subsequent read pulse applied to the memory cell 540. At Step 910, a read pulse is applied in a second polarity. The read pulse may be applied across the memory cell 540 to determine a state of the memory cell 540. The polarity of the read pulse may be different than the polarity of the programming pulse applied in Step 905. The magnitude of the read pulse may be based, at least in part, on the threshold voltages of the memory cell 540 in corresponding logic states. For example, the magnitude of the read pulse may be above the magnitude of the threshold voltage of the memory cell in a first logic state and below the magnitude of the threshold voltage of the memory cell in a second logic state.

Figure 10:
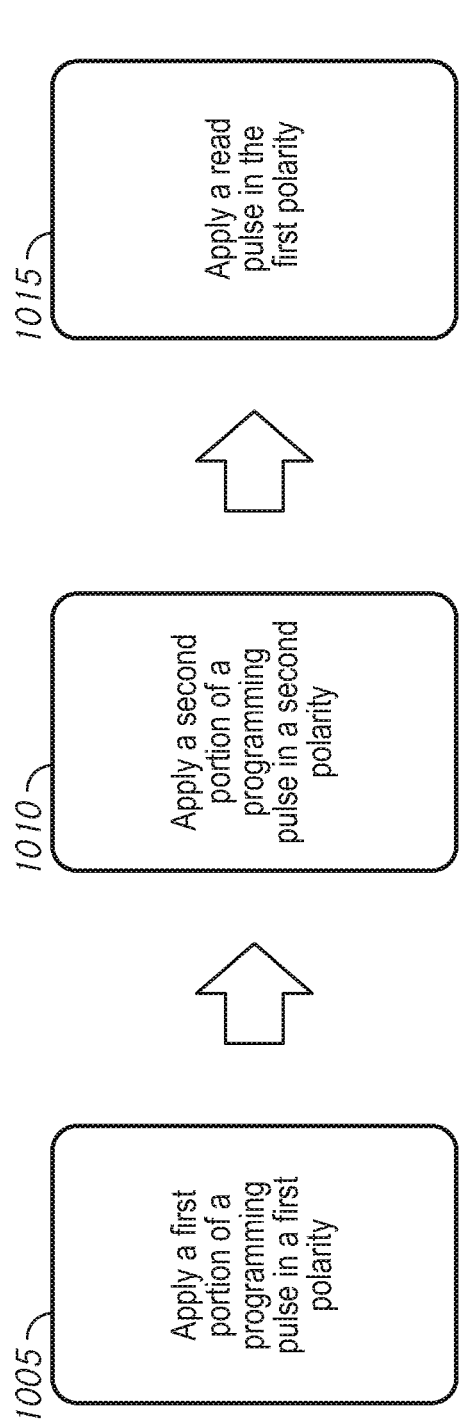
FIG. 10 is a flow chart of a method according to an embodiment of the disclosure.

FIG. 10 is a flow chart of a method 1000 for programming a memory cell according to an embodiment of the disclosure. For example, the method 1000 may be used with programming and read pulses shown in FIGS. 7 and 8A-B. In some embodiments, the method 1000 may be used by the memory 100 of FIG. 2 for programming logic states, and the memory cell may be implemented by memory cell 540 shown in FIG. 5. For example, the control logic 110 may provide internal control signals to various circuits in the memory 100 to perform the method 1000. At Step 1005, a first portion of a programming pulse is applied in a first polarity. The programming pulse may cause at least a temporary phase change to a portion of the memory element 525. A magnitude and/or duration of the first portion may be based on a logic state to be programmed to the memory element 525. For example, a high magnitude may be selected to program '0' and a low magnitude may be selected to program '1' to the memory element 525.

At Step 1010, a second portion of the programming pulse is applied in a second polarity. A polarity of the second portion may be selected based on a polarity of a subsequent read pulse applied to the memory cell. A magnitude and/or duration of the second portion may be based on material properties of the memory element and/or selector device of the memory cell. In some embodiments, the magnitude of the second portion may be less than a magnitude required to melt and/or change a phase of at least a portion of the memory element but equal to or greater than a magnitude required to reach an activation temperature to achieve a temperature effect in the selector device. The temperature effect may be the redistribution of atoms and/or electrons in the selector device in some embodiments. In some embodiments, the voltage and/or current magnitude of the second portion may be selected, at least in part, to mitigate an electric-field driven elemental segregation effect in the selector device, which may reduce a compositional gradient in the selector device.

At Step 1015, a read pulse is applied in the first polarity. The read pulse may be applied across the memory cell 540 to determine a state of the memory cell 540. The polarity of the read pulse may be different than the polarity of the second portion of the programming pulse applied in Step 1010. The magnitude of the read pulse may be based, at least in part, on the threshold voltages of the memory cell 540 in corresponding logic states. For example, the magnitude of the read pulse may be above the magnitude of the threshold voltage of the memory cell in a first logic state and below the magnitude of the threshold voltage of the memory cell in a second logic state.

Other programming and reading operations and/or modifications to the operations described herein may be used without departing from the principles of the disclosure. For example, in some methods, sensing currents and/or voltages may be limited to a specific time period. The time period may be from the initiation of a read pulse to a point in time after the initiation of the read pulse (e.g., 20 ns).

In some embodiments, a method similar to method 1000 described above and the programming and read pulses illustrated in FIGS. 7 and 8A-B may be used in a memory including memory cells that do not include separate memory elements and selector devices. The threshold voltage properties of a memory cell with this alternative architecture may allow an element of the memory cell to act as both a selector device and a memory element. An element of a memory cell that may act as both a selector device and a memory element will be referred to as a storage element. However, the storage element may sometimes be referred to as a memory element. The threshold voltage exhibited by the storage element may depend on the relative voltage polarities of read and programming pulses applied across the memory cell. For example, the storage element may exhibit a first threshold voltage when read if the memory cell was written to and then read with the same voltage polarity. The storage element may exhibit a second threshold voltage when read if the memory cell was written to and then read with different (e.g., opposite) voltage polarities. The storage element may be an element between electrodes in some embodiments.

A logic state may be programmed to the storage element of the memory cell, which may correspond to one or more bits of data. The memory cell may be programmed by applying voltages and/or currents of different polarities. The memory cell may be read by applying voltages of a single polarity. In some embodiments, the storage element may include a chalcogenide material. However, the chalcogenide material may or may not undergo a phase change during reading and/or writing. In some embodiments, the chalcogenide material may not be a phase change material.

FIG. 11 is an illustration of a portion of a memory array 1100 according to an embodiment of the disclosure. The memory array 1100 may be used to implement memory array 160 in FIG. 2 in some embodiments. The memory array 1100 may include a first access line 1105 and a second access line 1125. For ease of reference, the first access line may be referred to as a word line (WL) and the second access line may be referred to as a bit line (BL) 1125. The WL 1105 is perpendicular to the BL 1125. As shown in FIG. 11, WL 1105 extends parallel to the page and BL 1125 extends into and out of the page. A memory cell 1116 may be located at an intersection of the WL 1105 and the BL 1125. The memory cell 1116 may include a storage element 1115. The storage element 1115 may be coupled to WL 1105 by a first electrode 1110 and coupled to BL 1125 by a second electrode 1120. The storage element 1115 may include a chalcogenide. In some embodiments, the chalcogenide may be phase change material. In some embodiments, the chalcogenide does not undergo a phase change during operation of the memory cell 1116. In some embodiments, the storage element 1115 may include a ternary composition that may include selenium (Se), arsenic (As), and germanium (Ge). In some embodiments, the storage element 1015 may include a quaternary composition that may include silicon (Si), Se, As, and Ge. Other materials may also be used. The storage element 1115 may act as both a selector device and a memory element in some embodiments.

The memory cell 1116 may be programmed to store one of at least two different logic states '1,' '0') by a program operation. In some embodiments, the different logic states may be represented by different threshold voltages ($V_{TH}$) of the memory cell 1116. For example, a '1' logic state may be represented by a first $V_{TH}$ and a '0' logic state may be represented by a second $V_{TH}$. The threshold voltage the memory cell 1116 exhibits may be based on a polarity of a programming pulse applied to the memory cell 1116 during a programming operation and a polarity of a read pulse applied to the memory cell 1116 during a read operation. The programming pulse and read pulse may be applied to the memory cell 1116 using the first and second access lines 1105 and 1125.

The memory cell 1116 may be configured as a two-terminal device between the BL 1125 and WL 1105 in some embodiments. A first logic state may be programmed to the storage element 1115 of the memory cell 1116 by applying a voltage (e.g., a programming pulse) across the memory cell 1116 in a first polarity. A second logic state may be programmed to the memory cell 1116 by applying a voltage (e.g., a programming pulse) across the memory cell 1116 in a second polarity, which may be opposite to the first polarity. The memory cell 1116 is read by applying a voltage (e.g., a read pulse) across the terminals. In some embodiments, the memory cell 1116 is read by applying a voltage across the memory cell 1116 in the first polarity. In other embodiments, the memory cell 1116 is read by applying a voltage across the memory cell 1116 in the second polarity. The memory cell 1116 may always be read with the same polarity. When the memory cell 1116 is read with a voltage in the same voltage polarity with which the memory cell 1116 was programmed, the storage element 1115 may exhibit a first $V_{TH}$. When the memory cell 1116 is read with a voltage in the opposite voltage polarity with which the memory cell 1116 was programmed, the storage element 1115 may exhibit a second $V_{TH}$. The different threshold voltages may be used to represent different logic states. Additional details on a memory cell having the architecture as shown and described in reference to FIG. 11 may be found in U.S. patent application Ser. No. 14/932,746, which is herein incorporated by reference.

Similar to the selector device 525 of memory cell 540 shown in FIG. 5, the threshold voltage of the storage element 1115 may be based on the final portion of the programming pulse. In other words, the logic state programmed to the storage element 1115 may be based on the polarity of the final portion of the programming pulse. For example, a programming pulse may have a first portion and a second portion where the second portion is configured to program a logic state to the storage element 1115. In some embodiments, it may be advantageous to apply a programming pulse having a first portion and a second portion. For example, the memory cell and/or other components of the memory array may have greater performance (e.g., higher stability) if a first portion of a programming pulse is applied prior to the second portion. In another example, the memory array may include multiple memory cell types, and the first portion may program a first type of memory cells and the second portion may program a second type of memory cells. The magnitude and/or duration of the first portion may be based in part on the material properties of the memory cell and/or other portions of the memory.

Figure 12A:
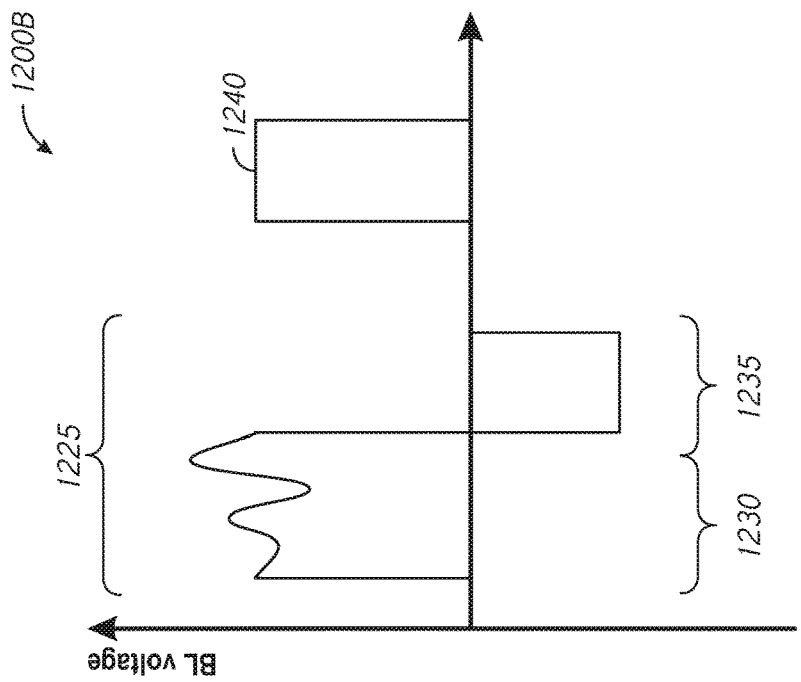
FIG. 12A is a voltage plot of a programming pulse having first and second portions according to an embodiment of the disclosure.
Figure 12B:
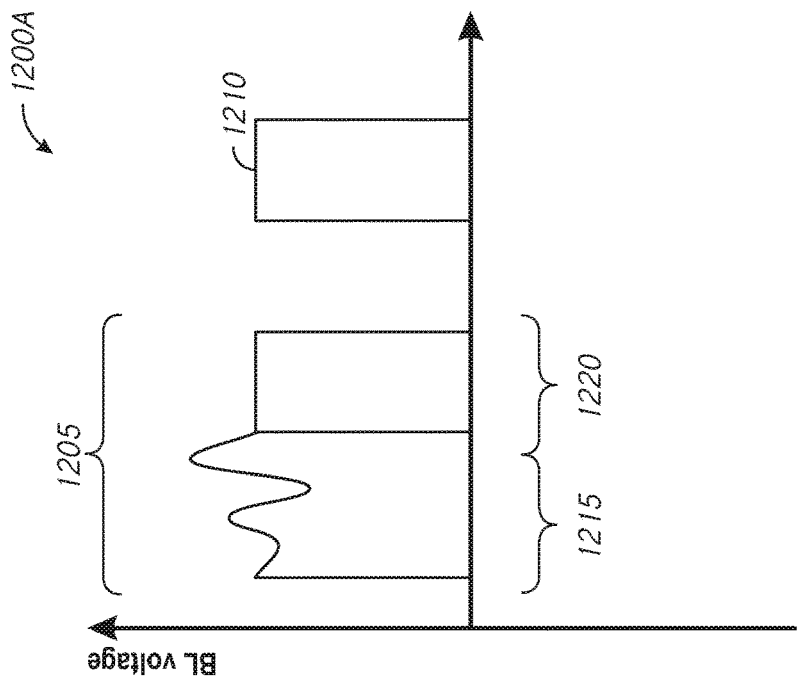
FIG. 12B is a voltage plot of a programming pulse having first and second portions according to an embodiment of the disclosure.

FIGS. 12A and 12B are voltage plots 1200A and 1200B of programming pulses 1205 and 1225 having first portions and second portions according to an embodiment of the disclosure. Programming pulse 1205 of FIG. 12A may be configured to program a first logic state to a memory cell, such as memory cell 1116 shown in FIG. 11. Programming pulse 1225 of FIG. 12B may be configured to program a second logic state in the memory cell. In some embodiments, the first portions 1215 and 1230 may program another type of memory cell, promote stability of the memory cell, and/or other component of the memory, and/or some other purpose. For example, the first portions 1215 and 1230 may reduce voltage drift of a component of the memory to improve stability. In another example, the first portions 1215 and 1230 may provide a control signal to a component of the memory including the memory cell. The component may be electrically coupled to the memory cell. The second portions 1220 and 1235 may program a logic state to the memory cell.

Referring to FIG. 12A, the first portion 1125 of programming pulse 1205 may include one or more voltages and/or currents in a first polarity each lasting a particular period of time. The shape of the first portion 1215 may be based, at least in part, on the characteristics of a memory cell or other components of the memory. Example characteristics include, but are not limited to, materials included in the memory cell and control signals provided to other components of the memory. In some embodiments, the first portion 1215 includes a plurality of pulses. In some embodiments the pulse or the plurality of pulses of the first portion 1215 may each include a ramp, staircase, or sinusoidal shape, and may have a leading and/or trailing edges. The second portion 1220 may include a voltage and/or current in the first polarity. The polarity of the second portion 1220 may be configured to program the first logic state to the memory cell. The second portion 1220 is shown as a square pulse in FIG. 12A, but the second portion 1220 may be other shapes (e.g., ramp, staircase, sinusoidal). In some embodiments, the second portion 1220 may have leading and/or trailing edges (not shown). The memory cell programmed by programming pulse 1205 may then be read by a read pulse 1210, which may be applied at the first polarity.

Referring to FIG. 12B, the first portion 1230 of programming pulse 1225 may include one or more voltages and/or currents in a first polarity each lasting a particular period of time. In some embodiments, the first portion 1230 includes a plurality of pulses. In some embodiments the pulse or the plurality of pukes of the first portion 1230 may each include a ramp, staircase, or sinusoidal shape, and may have a leading and/or trailing edges. The shape of the first portion 1230 may be based, at least in part, on the characteristics of a memory cell or other components of the memory. In some embodiments, the first portion 1230 may be the same as the first portion 1215 of programming pulse 1205. In some embodiments, the first portions 1215 and 1230 are different. The second portion 1235 may include a voltage and/or current in a second polarity. The polarity of the second portion 1235 may be configured to program the second logic state to the memory cell. The second portion 1235 is shown as a square pulse in FIG. 12B, but the second portion 1235 may be other shapes (e.g., ramp, staircase, sinusoidal) and/or may include leading and/or trailing edges (not shown). In some embodiments, second portion 1235 may be the same magnitude and duration as second portion 1220, but different polarity. In some embodiments, second portions 1235 and 1220 have different magnitudes and/or durations. The memory cell programmed by programming pulse 1225 may then be read by a read pulse 1240, which may be applied in the first polarity. In some embodiments, read pulse 1240 is the same as read pulse 1210.

Although first portions 1215 and 1230 are shown before second portions 1220 and 1235 in FIGS. 12A and 12B, in some embodiments, first portions 1215 and 1230 may follow second portions 1220 and 1235. Furthermore, although first portions 1215 and 1230 are shown as having positive polarity in FIGS. 12A and 12B, in some embodiments, first portions 1215 and 1230 may have negative polarity. Although not shown in FIGS. 12A and 12B, in some embodiments, second portions 1220 and 1235 are both preceded and followed by first portions 1215 and 1230. Similarly, although not shown in FIGS. 12A and 12B, in some embodiments, first portions 1215 and 1230 are both preceded and followed by second portions 1220 and 1235.

The programming pulses 1205 and 1225 shown in FIGS. 12A and 12B may be used to program a logic state to a storage element of a memory cell, such as storage element 1115 of memory cell 1116 shown in FIG. 11, during a programming operation. The programming pulses may be applied by providing a first voltage to the BL and providing a second voltage to the WL. Circuits coupled to access lines to which memory cells may be coupled may be used to provide the first voltage, for example, access line drivers included in the decoder circuits 140 and 150 of FIG. 2. The circuits may be controlled by the internal control signals provided by a control logic, for example, control logic 110 of FIG. 2. In some embodiments, the programming pulses may be configured by control signals provided by the control logic 110. The resulting voltage applied to the memory cell is the difference between the first and second voltages. The programming pulses may be the same duration as read pulses in some embodiments. In some embodiments the duration is 10 ns-50 ns. In some embodiments, the duration is 1-100 ns. In some embodiments, the duration is 1 ns-1 µs. In some embodiments, the first portion of the programming pulse is longer than the second portion of the programming pulse (e.g., 60-100 ns and 20n s-50 ns). In some embodiments, the first and second portions have equal durations (e.g., 50 ns and 50 ns). In some embodiments, the first portion is shorter than the second portion. Programming the memory cell may take more or less time as reading the memory cell in some embodiments.

Circuits coupled to access lines to which memory cells may be coupled may be used to provide the read pulses, for example, access line drivers included in the decoder circuits 140 and 150 of FIG. 2. The circuits may be controlled by the internal control signals provided by a control logic, for example, control logic 110 of FIG. 2. A read pulse may be a voltage $V_R$ applied to the memory cell for a period of time (e.g., 10 ns-50 ns, 1 ns-100 ns, 1 ns-1 µs). Although shown as square pulses in FIGS. 12A and 12B, read pulses of other shapes may be implemented. Other suitable read pulse shapes include, but are not limited to, triangular, trapezoidal, staircase, and/or sinusoidal. In some embodiments, read pulses may include leading and/or trailing edges. Although read pulses 1210 and 1240 are shown as having forward polarity, the read pulses 1210 and 1240 may be implemented in reverse polarity. In some embodiments, the read pulses may always be applied with the same polarity (e.g., all read pulses exhibit forward polarity, all read pulses exhibit reverse polarity).

Although the programming and read pulses shown in FIGS. 12A and 12B are plotted and described with respect to voltage, the pulses could be plotted and described with respect to current and be within the scope of the present disclosure. Voltage and current are proportionally related, and absent other factors, increasing or decreasing the current of a programming and/or read pulse may have a similar effect on the operation of a memory device as increasing or decreasing the voltage of a programming or read pulse in some embodiments.

Figure 13:
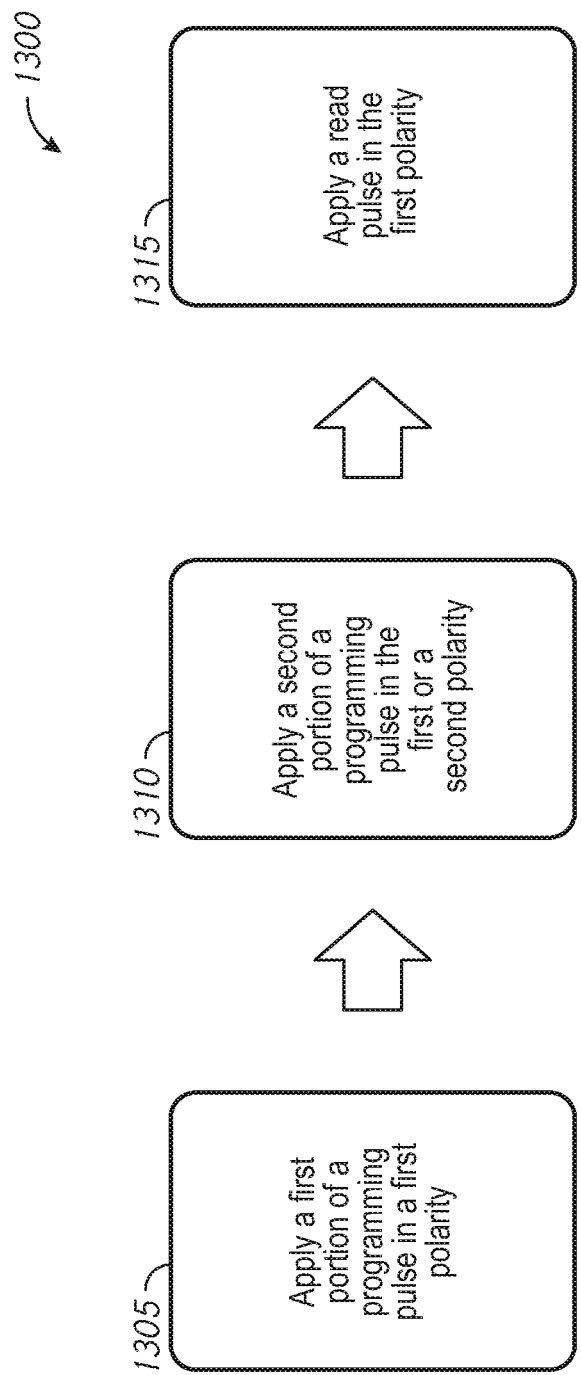
FIG. 13 is a flow chart of a method according to an embodiment of the disclosure.

FIG. 13 is a flow chart of a method 1300 for programming a memory cell according to an embodiment of the disclosure. For example, the method 1300 may be used with programming and read pulses shown in FIGS. 12A and 12B. In some embodiments, the method 1300 may be used by the memory 100 of FIG. 2 for programming logic states, and the memory cell may be implemented by memory cell 1116 shown in FIG. 11. For example, the control logic 110 may provide internal control signals to various circuits in the memory 100 to perform the method 1300. At Step 1305, a first portion of a programming pulse is applied in a first polarity. A magnitude and/or duration of the first portion may be based on properties of the storage element 1115, another portion of the memory cell 1116, and/or other portions of the memory 100. In some embodiments, the first portion may improve stability of a component of the memory 100. In some embodiments, the first portion may provide a control signal to a component of the memory 100. At Step 1310, a second portion of the programming pulse is applied in the first or a second polarity. A polarity of the second portion may be selected based on a logic state to be programmed to the storage element 1115. For example, the first polarity may be applied for a first logic state (e.g., '0') and the second polarity may be applied for a second logic state (e.g., '1'). At Step 1315, a read pulse is applied in the first polarity. The read pulse may be applied across the memory cell 1116 to determine a state of the memory cell 1116. The magnitude of the read pulse may be based, at least in part, on the threshold voltages of the storage element 1115 in corresponding logic states. For example, the magnitude of the read pulse may be above the magnitude of the threshold voltage of the storage element 1115 in a first logic state and below the magnitude of the threshold voltage of the storage element 1115 in a second logic state.

Apparatuses and methods of operation described herein may utilize applying currents and/or voltages across memory cells at different polarities to improve memory performance in some embodiments. For example, as described herein, voltage drift in selector devices may be improved when memory cells are programmed in a first polarity and read in a second polarity. In some embodiments, the improvement may be achieved by only changing the polarity of the final portion of the programming puke (e.g., final 10-50 ns). Other advantages may also be achieved. For example, the distribution of threshold voltages may be reduced by applying a programming pulse having two portions across a memory cell. The first portion may program a logic state to a memory element. The second portion may reduce the distribution of threshold voltages in a selector device. The second portion of the programming pulse may have a magnitude below a melting temperature of the memory element and above an activation temperature of the selector device. The second portion of the programming pulse may have a magnitude to mitigate an electric-field driven elemental segregation effect in the selector device, which may reduce a compositional gradient in the selector device. When the second portion of the programming pulse is in a different polarity from the read pulse, both the distribution of threshold voltages and voltage drift may be mitigated.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a memory cell comprising:
        a memory element; and
        a selector device coupled to the memory element;
    a first memory access line coupled to the memory cell;
    a second memory access line coupled to the memory cell; and
    a control logic configured to provide control signals for a programming pulse of the memory cell and the selector device,
    wherein a portion of the programming pulse is provided to the memory cell to change a material concentration in the selector device, and
    wherein the another portion of the programming pulse is provided to program a logic state of the memory element.

2. The apparatus of claim 1, wherein the other portion of the programming pulse provided to program the logic state of the memory element comprises a current magnitude or a voltage magnitude.

3. The apparatus of claim 1, wherein the portion of the programming pulse that is configured to change the material concentration in the selector device comprises a first polarity and the other portion of the programming pulse provided to program the logic state of the memory element comprises a second polarity.

4. The apparatus of claim 1, wherein the first memory access line and the second memory access line are set to either a forward polarity or reverse polarity.

5. The apparatus of claim 1, wherein the portion of the programming pulse that is configured to change the material concentration in the selector device corresponds to a change to a uniform concentration of a material in the selector device.

6. The apparatus of claim 5, wherein the change in the uniform concentration of the material in the selector device includes a change to the material in a top portion of the selector device and a change to the material in a bottom portion of the selector device.

7. The apparatus of claim 6, wherein the change to the material in the top portion of the selector device corresponds to changing the top portion of the selector device to have a higher concentration of Se than As in the material comprising an As—Se alloy.

8. The apparatus of claim 6, wherein the change to the material in the bottom portion of the selector device corresponds to changing the bottom portion of the selector device to have a higher concentration of As than Se in the material comprising an As—Se alloy.

9. The apparatus of claim 5, wherein the portion of the programming pulse that is configured to change the material concentration in the selector device includes not changing a material concentration of the memory element, such that a material concentration of the memory element remains substantially uniform.

10. The apparatus of claim 5, wherein the portion of the programming pulse that is configured to change the material concentration in the selector device comprises a current magnitude or a voltage magnitude.

11. The apparatus of claim 1, wherein the memory element comprises a phase change material and the programming pulse is configured by the control logic to change a phase of at least a portion of the phase change material.

12. An apparatus, comprising:
    a memory element configured to receive a programming pulse including a portion to write a logic state to the memory element; and
    a selector device coupled to the memory element and configured to receive the programming pulse,
    wherein another portion of the programming pulse having substantially a same duration as the portion of the programming pulse causes a change to a material state in the selector device.

13. The apparatus of claim 12, wherein the memory element is configured to receive a read pulse across the memory cell, the read pulse comprising a square shape, a triangular shape, a trapezoidal shape, a staircase shape, or a sinusoidal shape.

14. The apparatus of claim 12, further comprising a memory array including a plurality of memory cells and a plurality of memory access lines coupled to at least some of the plurality of memory cells, wherein the memory element and selector device are included in a memory cell of the plurality of memory cells.

15. The apparatus of claim 12, wherein the memory array is a two-dimensional array (2D) or a three-dimensional (3D) array.

16. The apparatus of claim 12, wherein the selector device comprises a chalcogenide material.

17. A method comprising:
- applying a portion of a programming pulse across a memory cell; and
- applying another portion of the programming pulse to change a material of a selector device coupled to the memory cell,
- wherein applying the another portion of the programming pulse to change the material of the selector device comprises altering a material concentration of the selector device.

18. The method of claim 17, wherein applying the portion of the programming pulse across the memory cell comprises writing a logic state to the memory cell.

* * * * *